(12) United States Patent
Reznicek et al.

(10) Patent No.: US 10,910,435 B2
(45) Date of Patent: Feb. 2, 2021

(54) STACKABLE SYMMETRICAL OPERATION MEMORY BIT CELL STRUCTURE WITH BIDIRECTIONAL SELECTORS

(71) Applicant: INTERNATIONAL BUSINESS MACHINES CORPORATION, Armonk, NY (US)

(72) Inventors: Alexander Reznicek, Troy, NY (US); Bahman Hekmatshoartabari, White Plains, NY (US); Oleg Gluschenkov, Tannersville, NY (US); Yasir Sulehria, Latham, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/366,629

(22) Filed: Mar. 27, 2019

(65) Prior Publication Data
US 2020/0312906 A1 Oct. 1, 2020

(51) Int. Cl.
*H01L 27/24* (2006.01)
*H01L 27/22* (2006.01)
(Continued)

(52) U.S. Cl.
CPC ............ *H01L 27/228* (2013.01); *G11C 5/063* (2013.01); *H01L 25/0657* (2013.01); *H01L 27/2454* (2013.01); *H01L 27/2481* (2013.01); *H01L 43/08* (2013.01); *H01L 43/10* (2013.01); *H01L 43/12* (2013.01); *H01L 45/06* (2013.01); *H01L 45/1206* (2013.01); *H01L 45/1253* (2013.01); *H01L 45/146* (2013.01); *H01L 45/1608* (2013.01); *H01L 45/1641* (2013.01); *H01L 45/1675* (2013.01); *H01L 45/1691* (2013.01)

(58) Field of Classification Search
CPC combination set(s) only.
See application file for complete search history.

(56) References Cited

U.S. PATENT DOCUMENTS

| 5,856,696 A | * | 1/1999 | Blanchard | ....... H01L 21/823807 |
| | | | | 257/371 |
| 6,667,897 B1 | * | 12/2003 | Abraham | .............. H01L 27/222 |
| | | | | 257/E27.005 |

(Continued)

OTHER PUBLICATIONS

Gokmen, T. et al., "Acceleration of Deep Neural Network Training with Resistive Cross-Point Devices: Design Considerations" Frontiers in Neuroscience (Jul. 2016) pp. 1-13, vol. 10, Article 333.

(Continued)

*Primary Examiner* — Moin M Rahman
(74) *Attorney, Agent, or Firm* — Tutunjian & Bitetto, P.C.; L. Jeffrey Kelly

(57) ABSTRACT

A method of forming an electrical device that includes forming an amorphous semiconductor material on a metal surface of a memory device, in which the memory device is vertically stacked atop a first transistor. The amorphous semiconductor material is annealed with a laser anneal having a nanosecond duration to convert the amorphous semiconductor material into a crystalline semiconductor material. A second transistor is formed from the semiconductor material. The second transistor vertically stacked on the memory device.

8 Claims, 13 Drawing Sheets

(51) Int. Cl.
*H01L 45/00* (2006.01)
*H01L 25/065* (2006.01)
*H01L 43/08* (2006.01)
*H01L 43/10* (2006.01)
*H01L 43/12* (2006.01)
*G11C 5/06* (2006.01)

(56) References Cited

U.S. PATENT DOCUMENTS

| | | |
|---|---|---|
| 8,791,534 B2 | 7/2014 | Fukami et al. |
| 9,236,416 B2 | 1/2016 | Shukh |
| 9,379,312 B2 | 6/2016 | Sugibayashi et al. |
| 9,406,720 B2 | 8/2016 | Hamamoto |
| 2010/0059837 A1* | 3/2010 | Kim .................. H01L 27/228 257/421 |
| 2016/0181319 A1* | 6/2016 | Tanaka ............... H01L 27/228 257/421 |
| 2016/0225818 A1 | 8/2016 | Toh et al. |
| 2016/0284980 A1 | 9/2016 | Tonegawa et al. |
| 2018/0165573 A1 | 6/2018 | Hsu et al. |
| 2019/0172927 A1* | 6/2019 | Jagannathan ....... H01L 29/6653 |

OTHER PUBLICATIONS

Mojumder, N.N. et al., "A three-terminal dual-pillar STT-MRAM for high-performance robust memory applications" IEEE Transactions on Electron Devices (May 2011) pp. 1508-1516, vol. 58, No. 5.

Sakimura, N. et al., "MRAM cell technology for over 500-MHz SoC" IEEE Journal of Solid-State Circuits (Apr. 2007) pp. 830-838, vol. 42, No. 4.

* cited by examiner

STACKABLE SYMMETRICAL OPERATION MEMORY BIT CELL STRUCTURE WITH BIDIRECTIONAL SELECTORS

BACKGROUND

The present invention generally relates to memory devices, and more particularly to vertically stacked memory devices. A magnetoresistive random access memory (MRAM) device includes an electrically connected array of magnetoresistive memory elements, referred to as magnetic tunnel junctions (MTJs). A basic structure of a magnetic tunnel junction includes two thin ferromagnetic layers separated by a thin insulating layer through which electrons can tunnel. The spin-transfer torque (STT) phenomenon is realized in an MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization. An MTJ stores information by switching the magnetization state of the magnetic free layer. MRAM devices are typically integrated with logic devices, e.g., field effect transistors (FET) on a same substrate. Simultaneous processing can be required to integrated MRAM devices and logic devices together in electrical components.

SUMMARY

In accordance with one aspect of the present disclosure, a vertically stacked two transistor (2T) one memory device, e.g., magnetic tunnel junction (1MTJ) device, is provided, in which the processing applied to the upper transistor does not adversely impact, or substantially degrade the performance of the underlying memory device, e.g., MTJ device. In one embodiment, the device includes a vertically stacked structure of a memory device overlying a lower transistor, and an upper transistor comprising crystalline semiconductor material directly atop a metal surface of the memory device. Following the application of annealing processes to the upper transistor, the underlying memory device can maintain the same magnetoresistance after the anneal as the magnetoresistance that the memory device had before the anneal.

In another aspect of the present disclosure, a method of forming a vertically stacked two transistor (2T) one memory device, e.g., magnetic tunnel junction (1MTJ) device, is provided, in which the processing applied to the upper transistor does not adversely impact, or substantially degrade the performance of the underlying memory device, e.g., MTJ device.

In one embodiment, the method of forming an electrical device includes forming an amorphous semiconductor material on a metal surface of a memory device, in which the memory device is vertically stacked atop a first transistor. The amorphous semiconductor material is annealed with a laser anneal having a nanosecond duration to convert the amorphous semiconductor material into a crystalline semiconductor material. A second transistor is formed from the crystalline semiconductor material. The second transistor vertically stacked atop the memory device. In some embodiments, three dimensional (3D) multilayered stacking over transistors atop memory devices is enabled by appropriate use of excimer laser annealing to convert low temperature deposited semiconductor materials into crystalline semiconductor materials, e.g., polycrystalline semiconductor materials, without damaging the underlying memory cells and metallization layers.

In another embodiment, the method of forming the electrical device includes forming an amorphous semiconductor material on a metal surface of a memory device, in which the memory device is vertically stacked atop a first transistor. The amorphous semiconductor material is annealed with a laser anneal having a nanosecond duration to convert the amorphous semiconductor material into a crystalline semiconductor material. A first source/drain region of a second transistor is formed from the crystalline semiconductor material. A channel region is epitaxially formed atop the first source/drain region, and a second source/drain region is epitaxially formed atop the channel region to provide a vertical orientation for the second transistor.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
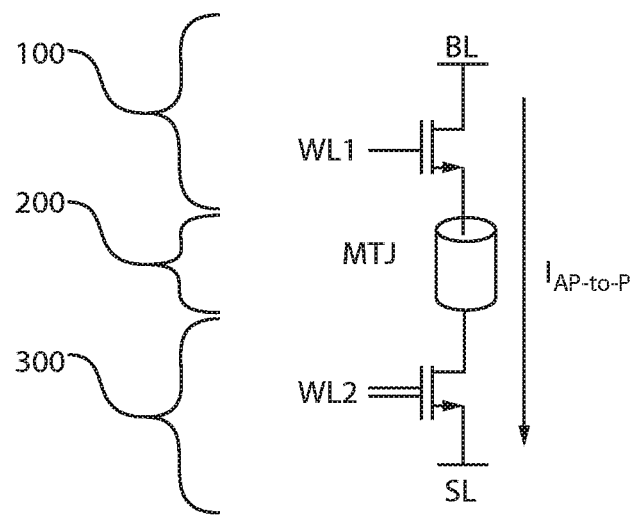
FIG. 1A is a circuit diagram illustrating a vertically stacked two transistor (2T) one magnetic tunnel junction (1MTJ), in which the current is in a direction from the bit line (BL) to the select line (SL), in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Emerging memory applications, such as spin-transfer torque (STT) magnetic tunnel junctions (MTJs) and resistive random access memory (RRAM) require bidirectional selection for efficient operation. Transistor selectors enable bidirectional operation, but introduce some asymmetry because depending on the voltage polarity of the operation, the transistor terminal connected to the memory elements may be the functional drain or the functional source. This issue is particularly problematic for multi-state or synaptic memories. This issue can be addressed by using additional transistors in the bit cell, but that results in increasing the bit cell area.

The methods and structures described herein enable the use of a vertically stacked two (2) transistor/one (1) memory bit cell in a three dimensional (3D) multilayer cross-point memory array. The impact of doubling the transistor count is countered by vertically stacking the second transistor on the memory element and the first transistor. 3D multilayer stacking is enabled by appropriate use of excimer laser annealing to convert low-temperature deposited semiconductors into polycrystalline semiconductors without damaging the underlying memory cells and the metallization lines.

Figure 1B:
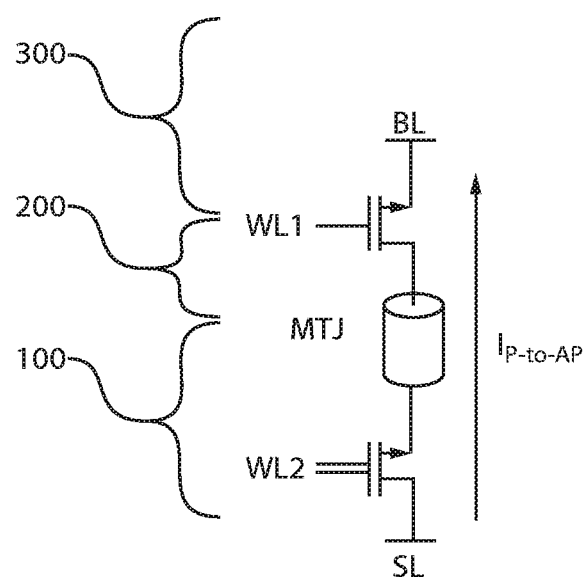
FIG. 1B is a circuit diagram illustrating a vertically stacked two transistor (2T) one magnetic tunnel junction (1MTJ), in which the current is in a direction from the select line (SL) to the bit line (BL), in accordance with one embodiment of the present disclosure.

FIGS. 1A and 1B are circuit diagrams illustrating some embodiments of a vertically stacked two transistor (2T) one magnetic tunnel junction (1MTJ). The lower transistor (also referred to as first transistor) is identified by reference number 100 and has a gate structure connected to word line 2 (WL2), and the upper transistor (also referred to as second transistor) is identified by reference number 300 and has a gate structure connected to word line 1 (WL1). In the example depicted in FIGS. 1A and 1B, the lower transistor (first transistor) 100 and the upper transistor (second transistor) 300 are n-channel vertical field effect transistors (VFETs). As will be appreciated by a person of ordinary skill in the art, p-channel transistors may be used as well, with voltage polarities opposite to that used for n-channel transistors used for operation of p-channel transistors.

A memory device identified by reference number 200 is positioned between the upper transistor 300 and the lower transistor 100. In the embodiment depicted in FIGS. 1A and 1B, the lower and upper transistors 100, 300 are n-channel field effect transistors (nFETs), but p-channel field-effect transistors (p-FETs) may be used as well. The lower transistor 100 is in electrical communication with a select line (SL) through a source/drain region. The upper transistor 200 is in electrical connection with a bit line (BL) through a source/drain region.

In the embodiment that is depicted in FIG. 1A, the current ($I_{AP\text{-}to\text{-}P}$) is in a direction from the upper transistor 300 to the lower transistor 100. To generate the current $I_{AP\text{-}to\text{-}P}$, a positive gate-to-source voltage, $V_{GS}$, is applied across WL2 and SL, which are connected to the gate terminal and the functional source terminal of the lower transistor 100, respectively. The generated current $I_{AP\text{-}to\text{-}P}$ is a function of the applied $V_{GS}$, and is independent of the MTJ resistance provided that the voltage across BL and SL is large enough for the lower transistor 100 to operate in saturation. In the embodiment depicted in FIG. 1A, the $V_{GS}$ applied to the lower transistor 100 is equal to a supply voltage $V_{DD}$, i.e., the $V_{GS}=V_{DD}$. During this operation, the WL1, BL and SL may be connected to, for example, $V_{HH}$, $V_{HH}$ and ground, respectively, where $V_{HH}$ is a supply voltage large enough to ensure the bottom transistor 100 is operated in saturation. For example $V_{HH}$ may be equal to, or greater than $2V_{DD}$. Other bias arrangements may be used as well.

In the embodiment that is depicted in FIG. 1B, the current ($I_{P-to-AP}$) is in a direction from the lower transistor 100 to the upper transistor 300. To generate $I_{P-to-AP}$, a positive gate-to-source voltage, $V_{GS}$, is applied across WL1 and BL, which are connected to the gate terminal, and the functional source terminal of the upper transistor 300, respectively. The generated current $I_{P-to-AP}$ is a function of the applied $V_{GS}$, and is independent of the MTJ resistance provided that the voltage across SL and BL is large enough for the upper transistor 300 to operate in saturation. In the embodiment depicted in FIG. 1B, the $V_{GS}$ applied to the upper transistor 300 is equal to a supply voltage $V_{DD}$, i.e., the $V_{GS}=V_{DD}$. During this operation, the WL2, SL and BL may be connected to, for example, $V_{HH}$, $V_{HH}$ and ground, respectively, where $V_{HH}$ is a supply voltage large enough to ensure the upper transistor 100 is operated in saturation. For example, $V_{HH}$ may be equal to, or greater than $2V_{DD}$. Other bias arrangements may be used as well.

Further referring to the embodiments of FIGS. 1A and 1B, if the upper transistor 300 and the lower transistor 100 are substantially identical to each other, and the $V_{GS}$ values used for generating $I_{AP-to-P}$ (as explained with respect to FIG. 1A) and $I_{P-to-AP}$ (as explained with respect to FIG. 1B) are also substantially the same as each other, then by way of symmetry, $I_{AP-to-P}$ has substantially the same value as $I_{P-to-AP}$. Therefore, symmetrical memory operation can be enabled by the configuration described with respect to FIGS. 1A and 1B. With respect to embodiments where the memory element 200 is an MTJ, the current $I_{AP-to-P}$, when sufficiently large, changes the magnetization of the MTJ from anti-parallel (AP) to parallel (P); whereas, the current $I_{P-to-AP}$, when sufficiently large, changes the magnetization of the MTJ from parallel (P) to anti-parallel (AP), in one or more embodiments.

Figure 2A:
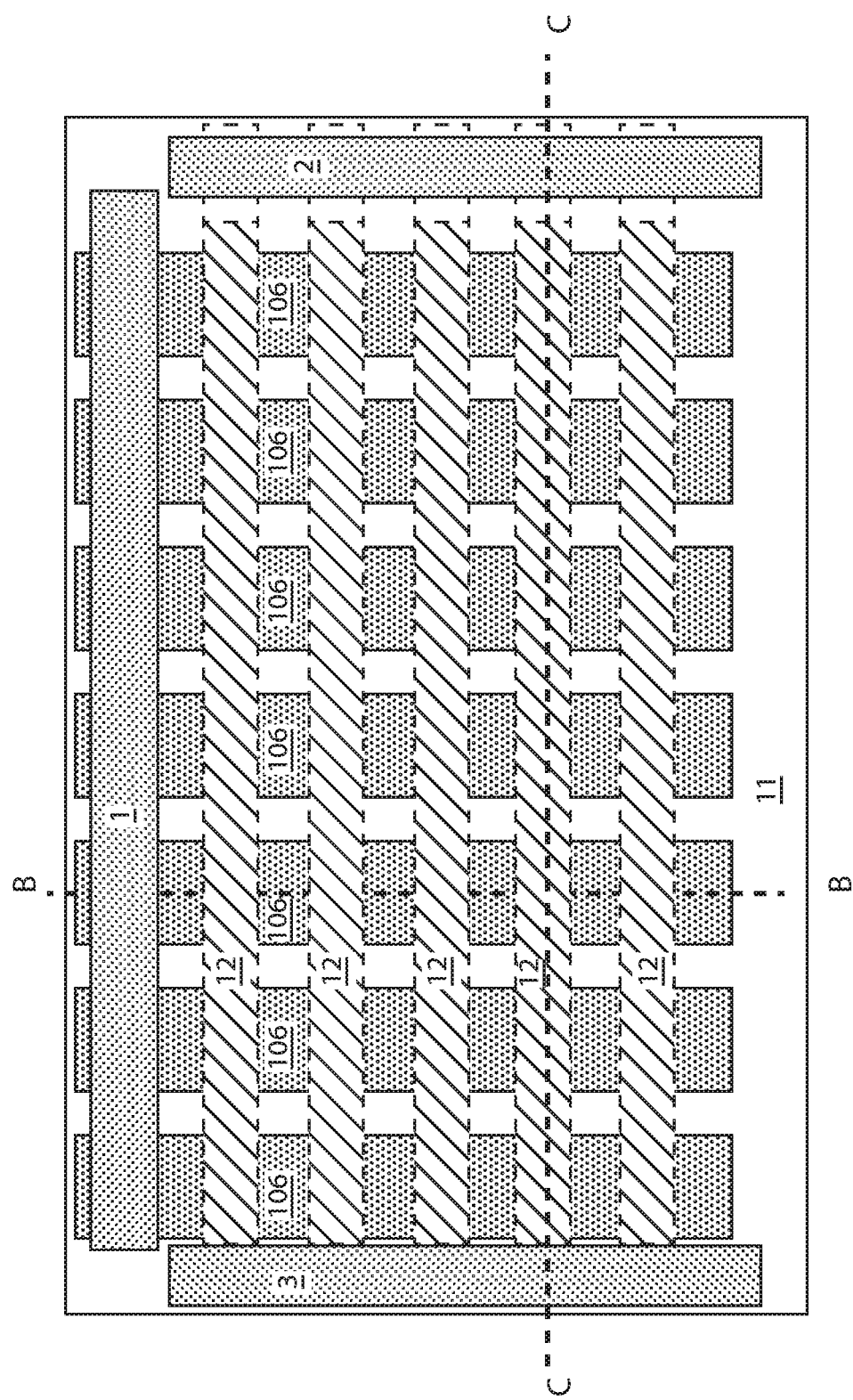
FIG. 2A is a top down view of a device array including a plurality of vertically stacked two transistor (2T) one magnetic tunnel junction (1MTJ), in accordance with one embodiment of the present disclosure.
Figure 2B:
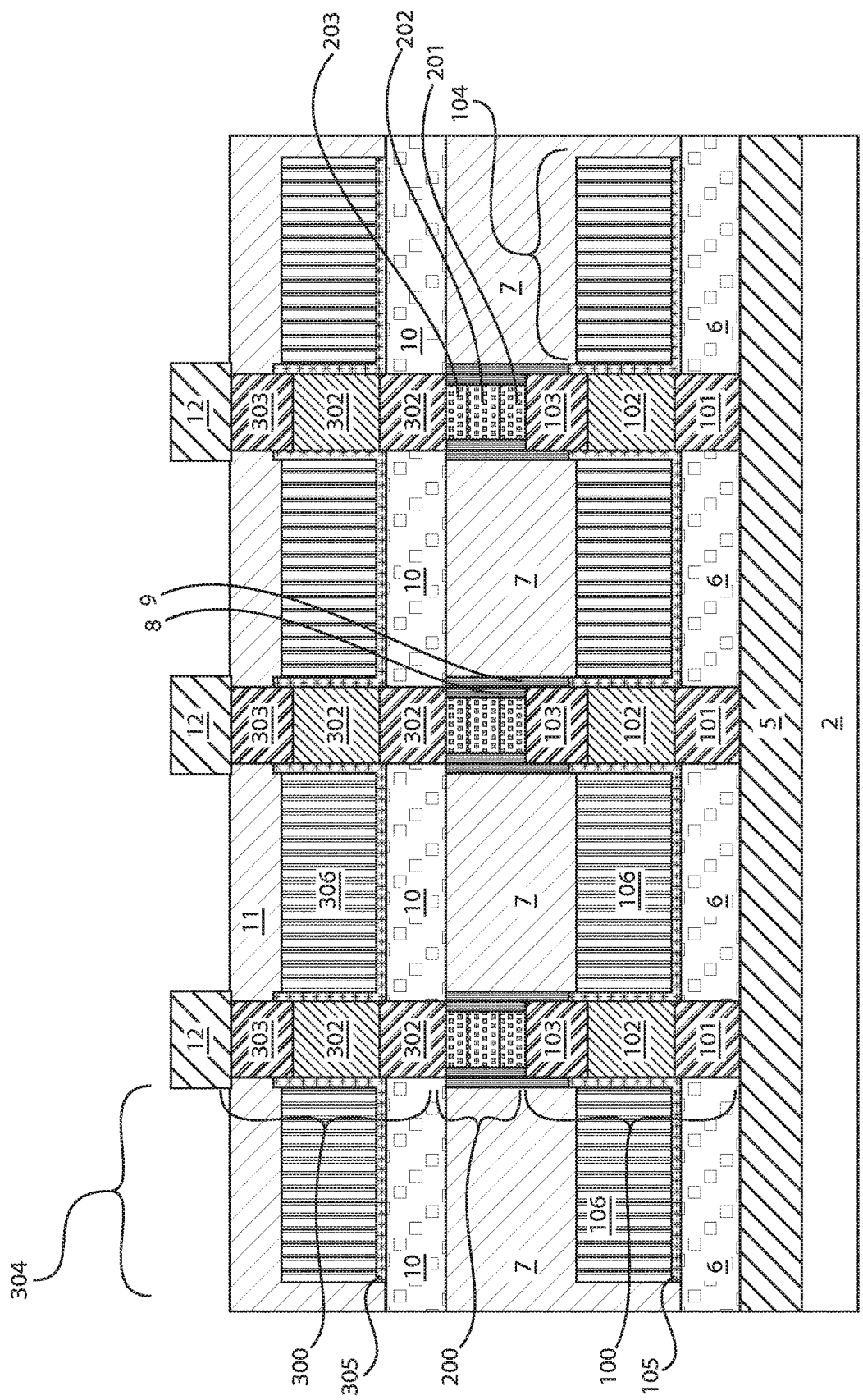
FIG. 2B is a side cross-sectional view of the device array depicted in FIG. 2A along section line B-B, which is a vertical cross section.
Figure 2C:
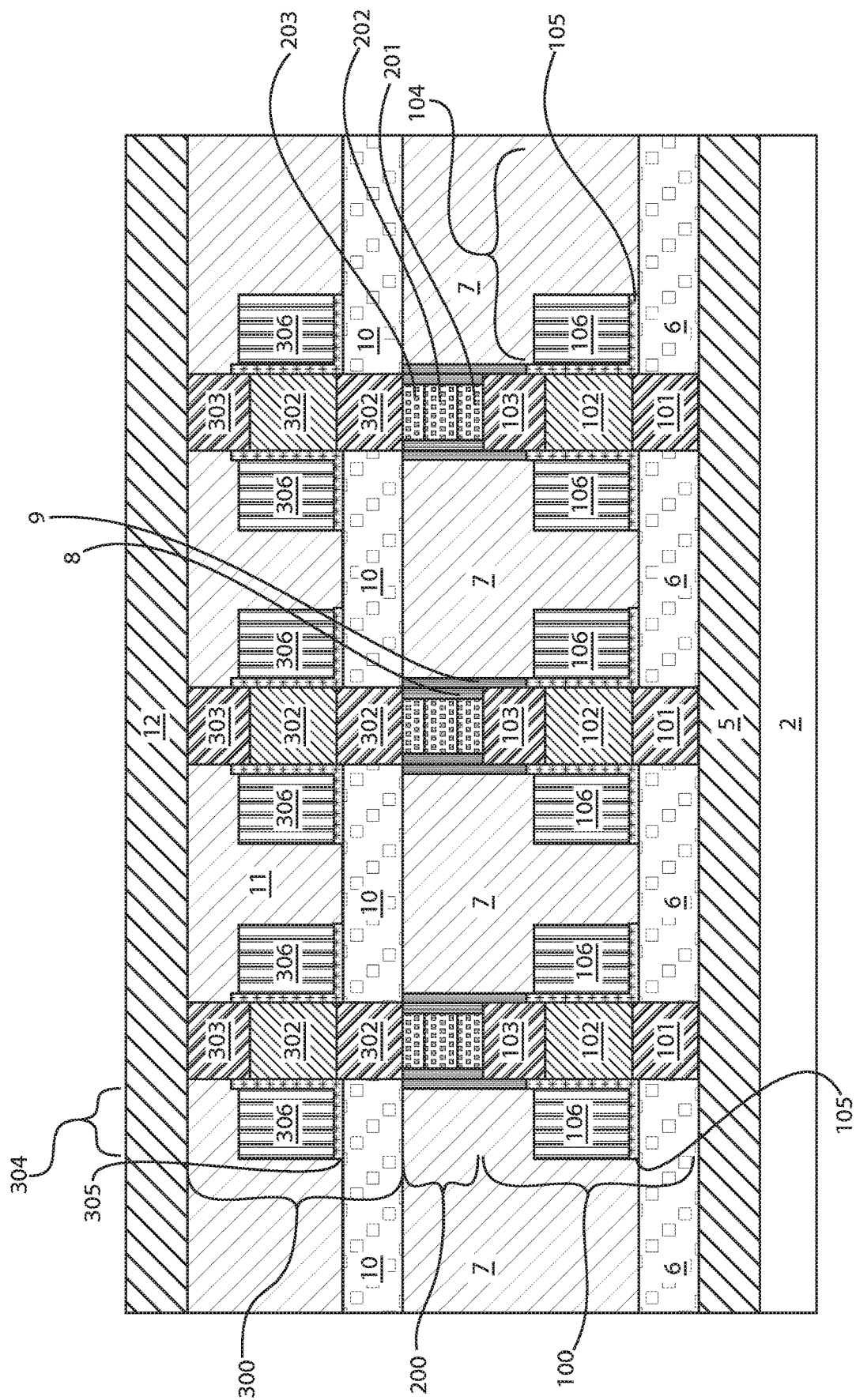
FIG. 2C is a side cross-sectional view of the device array depicted in FIG. 2A along section line C-C, which is a horizontal cross section.

In some embodiments, the circuit diagrams illustrated in FIGS. 1A and 1B, the lower transistor 100, the memory device 200, e.g., magnetic tunnel junction (MTJ), and the upper transistor 30 may be vertically stacked in a configuration as depicted in FIGS. 2A-2C. The two transistor (2T) one memory device (1MTJ) bit-cell, e.g., (2T-1MJT) bit-cell, depicted in FIGS. 1A-2C enables symmetric operation, as explained above with respect to FIGS. 1A and 1B. However, three dimensional (3D) stacked structures can be difficult to process due to the annealing of the upper structures damaging or degrading the previously formed underlying structures. For example, it has been determined that subjecting the memory device 200, e.g., MTJ, to the anneal processing for forming the upper transistor 300 will destroy, or severely degrade, the underlying memory device 200. In the methods and structures of the present disclosure, degradation of the memory device 200, e.g., MTJ memory device, that occurs when annealing the overlying upper transistor 300 can be avoided using low temperature deposition processes, e.g., low temperature epitaxial growth, and annealing processes that reduce the thermal budget to not degrade the crystallinity of the memory device 200, e.g., MTJ memory device. For example, in some embodiments, the memory devices 200, e.g., MTJ memory devices, may be subjected to a nanosecond (nsec) laser anneal up to temperatures of 1150° C. applied to the upper transistor 300 without the anneal degrading the performance of the memory device 200, e.g., MTJ memory device.

FIGS. 2A-2C depict one example of a two transistor (2T)-one memory device (1MTJ) bit-cell, e.g., (2T-1MJT) bit-cell. The lower transistor 100 (also referred to as first transistor) is present on a metal line 5, e.g., select line (SL), wherein the metal line may be formed in an interlevel dielectric layer (ILD) 2. The interlevel dielectric layer (ILD) 2 may be present atop a supporting substrate (not shown), which may be a semiconductor substrate, such as a semiconductor on insulator (SOI) substrate or a bulk semiconductor substrate. Although not depicted in the supplied figures, the underlying semiconductor substrate may house a number of active electronic devices, such as logic devices, e.g., transistors, and memory devices, and/or the underlying semiconductor substrate may house passive electronic devices, such as capacitors, resistors, diodes, etc.

Still referring to FIGS. 2A-2C, the interlevel dielectric layer (IDL) 2 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 2 include any of the aforementioned materials in porous form, or in a form that changes during processing to or from being porous and/or permeable to being non-porous and/or non-permeable.

FIGS. 2A-2C also depict a metal line 5 that is integrated with the interlevel dielectric layer (ILD) 2. In some embodiments, each memory element, e.g., two transistor (2T)-one memory device (1MTJ) bit-cell, i.e., (2T-1MJT) bit-cell, or cell can store one data bit, and it has a first word line (WL1), a second word line (WL2), a bit line (BL) and a select line (SL). In some embodiments, WL1 and WL2 are used for addressing (i.e. selectively activating) the cell and the BL and/or SL are used to input/output data. In some embodiments, the lower transistor 100 is in electrical communication with a select line (SL). In some embodiments, the metal line 5 that provides the select line (SL) is composed of an electrically conductive material, such as a metal or metal containing material, e.g., copper (Cu), aluminum (Al), tungsten (W), tungsten nitride (WN), titanium (Ti), titanium nitride (TiN), and combinations thereof.

FIGS. 2A-2C depict one embodiment of a first transistor 100 being in electrical contact with the metal line 5. The first transistor 100 may be a field effect transistor (FET). A field effect transistor (FET) is a semiconductor device in which output current, i.e., source-drain current, is controlled by the voltage applied to a gate structure to the semiconductor device. A field effect transistor has at least three terminals, i.e., gate structure, source region and drain region. In the embodiment that is depicted in FIGS. 2A-2C, the first transistor is a vertical field effect transistor (VFET). A vertical FET (VFET) semiconductor device has the drain, a channel, and source device components arranged perpendicular to the plane of the underlying surface that the VFET is formed on, e.g., the metal line 5, and can be referred to as a vertical stack of the drain region, channel region and source region. The gate structure may be formed on the channel region.

In the two transistor (2T)-one memory device (1MTJ) bit-cell, e.g., (2T-1MJT) bit-cell, that is depicted in FIGS. 2A-2C, the first transistor 100 is in closest proximity to the interlevel dielectric layer (ILD) 2, and the underlying substrate, and is referred to as the lower transistor; while the second transistor 300 is further from the interlevel dielectric layer (ILD) 2, and the underlying substrate, and is referred to as the upper transistor. The upper and lower designation for the second and first transistors 300, 100 is consistent with their orientation in FIGS. 2A-2C.

As used herein, the term "drain" and/or "drain region" means a doped region in semiconductor device located at the end of the channel, in which carriers are flowing out of the transistor through the drain. As used herein, the term "source" and/or "source region" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term "source/drain region" is suitable for describing these doped regions in the absence of the bias that designates their type.

The first source/drain region 101 may be composed of a type IV or type III-V semiconductor. By "type IV semiconductor" it is meant that the semiconductor material includes at least one element from Group IVA (i.e., Group 14) of the Periodic Table of Elements. Examples of type IV semiconductor materials that are suitable for the first source/drain region 101 include silicon (Si), germanium (Ge), silicon germanium (SiGe), and a combination thereof.

Although the majority of the examples provided herein employ a type IV semiconductor for the first source/drain region 101, the present disclosure is not limited to only this example. In other embodiments, the first source/drain region 101 may be an III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

The first source/drain region 101 is typically composed of a recrystallized semiconductor material. As will be described in further detail below, the first source/drain region may be deposited in an amorphous form, or other low crystalline form, such as microcrystalline or nanocrystalline, directly on the metal line 5, in which following deposition the amorphous material is recrystallized into a crystalline crystal structure. The recrystallization process may be a laser anneal, or other process having a similar thermal budget, that does not damage the underlying metal line 5. As will be described in further detail below, the recrystallization process may be a laser anneal having a nanosecond duration and a temperature of up to 1150° C.

The term "crystalline" includes single crystal and polycrystalline crystal structures. The term "single crystalline" denotes a crystalline solid, in which the crystal lattice of the entire sample is substantially continuous and substantially unbroken to the edges of the sample, with substantially no grain boundaries. Contrary to a single crystal crystalline structure, a "polycrystalline" structure is a form of semiconductor material made up of randomly oriented crystallites. In some examples, the first source/drain region 101 is composed of a polycrystalline material, such as polysilicon.

The first source/drain region 101 is typically doped to a conductivity type that provides the conductivity type of the semiconductor device. For example, if the first source/drain region 101 is doped to an n-type conductivity, the semiconductor device is an n-channel device, e.g., an n-channel vertical FET. For example, if the first source/drain region 101 is doped to a p-type conductivity, the semiconductor device is a p-channel device, e.g., a p-channel vertical FET.

The channel region 102 of the first transistor 100 is present atop, i.e., vertically stacked on, the first source/drain region 101. Similar to the first source/drain region 101, the channel region 102 may be composed of a type IV semiconductor material or a type III-V semiconductor material. The channel region 102 may be composed of a base semiconductor composition that is the same or different from the first source/drain region 101. For example, the channel region 102 may be composed of a silicon-containing material, e.g., silicon (Si). As will be described in greater detail below, the channel region 102 is formed in direct contact with and in epitaxial arrangement with the first source/drain region. In this example, the channel region 102 is composed of polycrystalline semiconductor material, which is provided by an epitaxial deposition process. The epitaxial deposition process for forming the channel region 102 has a thermal budget that does not damage the underlying metal line 5.

In other examples, the channel region 102 is composed of non-epitaxially deposited semiconductor material, such as a semiconductor material having an amorphous crystal structure, a semiconductor material having a microcrystalline crystal structure and/or a semiconductor material having a nanocrystalline crystal structure. Microcrystalline and nanocrystalline materials can be characterized by having islands of crystalline material in an amorphous matrix.

The channel region 102 may be intrinsic or may be lightly doped with an opposite conductivity type dopant as the first source/drain region 101 and the second source/drain region 103. For example, if the first and second source/drain regions 101, 103 are doped to an n-type conductivity, the channel region 102 is doped to a p-type conductivity.

The second source/drain region 103 is present atop, i.e., vertically stacked on, the channel region 102 of the first transistor 100. Similar to the first source/drain region 101, the second source/drain region 103 may be composed of a type IV semiconductor material or a type III-V semiconductor material. The second source/drain region 103 may be composed of a base semiconductor composition that is the same or different from the first source/drain region 101. For example, the second source/drain region 103 may be composed of a silicon-containing material, e.g., silicon (Si). As will be described in greater detail below, the second source/drain region 103 is formed in direct contact with and in epitaxial arrangement with the channel region 102. In this example, the first second source/drain region 103 is composed of polycrystalline semiconductor material, which is provided by an epitaxial deposition process. The epitaxial deposition process for forming the second source/drain region 103 has a thermal budget that does not damage the underlying metal line 5. In other examples, the second source/drain region 103 is composed of non-epitaxially deposited semiconductor material, such as a semiconductor material having an amorphous crystal structure, a semiconductor material having a microcrystalline crystal structure and/or a semiconductor material having a nanocrystalline crystal structure.

The second source/drain region 103 may be doped to the same conductivity type as the first source/drain region 101. For example, if the first source/drain region 101 is doped to an n-type conductivity, the second source/drain region 103 is doped to an n-type conductivity.

In the embodiment depicted in FIGS. 2A-2C, the second source/drain region 103 of the first transistor 100 is a drain region that is in direct contact with the memory device 200, e.g., magnetic tunnel junction (MTJ) memory device 200, consistent with the circuit diagrams depicted in FIGS. 1A and 1B.

The sidewalls of the first source/drain region 101, the channel region 102 and the second source/drain region 103 in the vertical stack for the first transistor 100 are aligned to one another. This can result from the subtractive processing, e.g., photolithography and etching, that forms the vertical stack, in which a same etch mask is used to define each of the first source/drain region 101, the channel region 102 and the second source/drain region 103.

The first transistor 100 may also include a gate structure 104 that is in electrical communication with the channel region 102 of the first transistor 100. The gate structure 104 is a functional gate structure that operates to switch the semiconductor device from an "on" to "off" state, and vice versa. In some embodiments, the gate structure 104 wraps around the channel region 102 of the first transistor 100. The gate structure 104 may include at least one gate dielectric 105 and at least one gate electrode 106.

The gate dielectric 105 may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, the gate dielectric 105 may have a thickness ranging from about 1.0 nm to about 6.0 nm.

In some embodiments, the gate electrode 106 of the gate structure 104 may be composed of a metal, such as a high work function metal and/or a low work function metal. In one embodiment, the work function of the high work function metal layer ranges from 4.9 eV to 5.2 eV. In one embodiment, the high work function metal is composed of titanium nitride (TiN). In some embodiments, the high work function metal may be composed of TiAlN, Ru, Pt, Mo, Co and alloys and combinations thereof. In one embodiment, the work function of the low work function metal ranges from 4.1 eV to 4.3 eV. In one embodiment, the low work function metal is composed of at least one of TiAl, TaN, TiN, HfN, HfSi, or combinations thereof.

In some other embodiments, the gate electrode (also referred to as gate conductor) 106 may be composed of doped semiconductor, e.g., n-type polysilicon or p-type polysilicon. Increasing the work function of the gate electrode increases the threshold voltage (e.g. to more positive values for n-channel transistors and to less negative values for p-channel transistors); whereas reducing the workfunction of the gate electrode decreases the threshold voltage (e.g. to less positive values for n-channel transistors and to more negative values for p-channel transistors).

In some other embodiments, the gate electrode (also referred to as gate conductor) 106 may be composed of doped semiconductor, e.g., n-type polysilicon.

The gate structure 104 may be separated from the metal line 5, e.g., select line (SL), by at least one dielectric layer 6. For example, the at least one dielectric layer 6 may be an oxide, such as silicon oxide ($SiO_2$). In some embodiments, the at least one dielectric layer 6 may be a nitride, such as silicon nitride, or a silicon oxynitride. In some embodiments, the gate structure 104 may further be separated from the metal line 5, e.g., select line by a horizontally orientated portion of the gate dielectric 105 that extends between a lower face of the gate electrode 106 and the at least one dielectric layer 6.

The gate electrode 105 of the gate structure 104 may be in electrical communication with a word line. In some embodiments, the memory cells, e.g., the two transistor (2T)-one memory device (1MTJ) bit-cell, e.g., (2T-1MJT) bit-cell, are positioned in an array of columns (bit lines) and rows (word lines), as depicted in FIG. 2A. The intersection of a bit line and word line constitutes the address of the memory cell. For example, the gate electrode 105 of the gate structure 104 may be in electrical communication with word line 2 (WL2), as depicted in the circuit diagrams depicted in FIGS. 1A and 1B.

Referring to FIGS. 2A-2C, a memory device 200 is formed in direct contact with the second source/drain region 103 of the first transistor 100. The memory device 200 may be selected from the group consisting of a phase change memory (PCM) device, a magnetic random access memory (MRAM) device, a resistive random access memory (RRAM) device or any other memory device needing access transistors.

In some embodiments, the memory device 200 may be a magnetic tunnel junction (MTJ) type device. An MJT structure includes two thin ferromagnetic layers separated by a thin insulating layer through which electrons can tunnel. The spin-transfer torque (STT) phenomenon is realized in an MTJ structure, wherein one ferromagnetic layer (referred to as "magnetic free layer" or "free magnetization layer") has a non-fixed magnetization, and the other ferromagnetic layer (referred to as a "magnetic pinned layer", or "reference layer", or "fixed magnetization layer") has a "fixed" magnetization. An MTJ stores information by switching the magnetization state of the magnetic free layer.

In some embodiments, the magnetic orientation of the magnetic layers, i.e., the free magnetization layer 203 and the fixed magnetization layer 201, of the magnetic tunnel junction (MTJ) structure for the memory device 200 is in a perpendicular direction. The perpendicular direction, for example, refers to the direction which is perpendicular to the surface of an interlevel dielectric layer (ILD) 5, or perpendicular to the plane of the layers of the MTJ structure. In one embodiment, a magnetically fixed layer, i.e., fixed magnetization layer 201, is disposed below the magnetic free layer, i.e., free magnetization layer 203, forming a bottom pinned perpendicular MTJ (pMTJ) element. The perpendicular direction of the fixed layer is in a first perpendicular direction. The first perpendicular direction is shown to be in an upward direction away from the interlevel dielectric layer (ILD) 5, and underlying supporting substrate (not shown). Providing the first perpendicular direction which is in a downward direction towards the interlevel dielectric layer (ILD) 5, and underlying supporting substrate (not shown), may also be useful. As for the magnetic orientation of the free layer, it may be programmed to be in a first or same (parallel) direction as the fixed layer or in a second or opposite (anti-parallel) direction as the fixed layer.

Each of the fixed magnetization layer 203 and the free magnetization layer 201 may be composed of a ferromagnetic material. For example, each of the fixed magnetization layer 203 and the free magnetization layer 201 may be composed of a composition including cobalt (Co), iron (Fe), nickel (Ni), boron (B), or any combination thereof. In one example, the fixed magnetization layer 203 can be formed of CoFeB or CoFe. In one example, the free magnetization layer 201 can be formed of CoFeB or CoFe. Each of the fixed magnetization layer 203 and the free magnetization layer 201 may have a thickness ranging from 10 nm to 100 nm. In some embodiments, each of the fixed magnetization layer 203 and the free magnetization layer 201 may have a thickness ranging from 20 nm to 50 nm.

In some embodiments, the fixed magnetization layer 203 may include a synthetic antiferromagnet (SAF) consisting of two ferromagnetic layers antiferromagnetically coupled through a nonmagnetic spacer layer (such as Ru). In some embodiments, the dipolar interaction between the two magnetic electrodes results in a highly asymmetrical reversal of the free layer, i.e., free magnetization layer 201, with respect to the applied field or to the current density. In one embodiment, the synthetic antiferromagnet (SAF) employed for the fixed magnetization layer 203 may include a stack of $Ta_3/Pt_{30}/(Co_{0.5}/Pt_{0.4})_5/Co_{0.5}/Ru_{0.85}/(Co_{0.5}/Pt_{0.4})_3/Co_{0.5}/CoFeBi$.

A tunnel junction dielectric layer 202 is present between the fixed magnetization layer 203 and the free magnetization layer 201 and is the site of tunnel magnetoresistance (TMR), which is the magnetoresistive effect that occurs in the magnetic tunnel junction (MTJ) structure. The tunnel junction dielectric layer 202 can be formed of a non-magnetic, insulating material such as magnesium oxide (MgO), aluminum oxide ($Al_2O_3$), or titanium oxide ($TiO_2$) or any other suitable materials. The tunnel junction dielectric layer 202 may have a thickness ranging from 1 nm to 5 nm. In some embodiments, the tunnel junction dielectric layer 202 may have a thickness ranging from 1 nm to 2 nm.

A metal electrode layer (not shown) may be present between the free magnetization layer 201 and the second source/drain region 103 of the first transistor 100. A metal electrode layer (not shown) may also be present between the fixed magnetization layer 201 and the first source/drain region 301 of the overlying second transistor 300. The metal electrode layers may also be referred to as a top electrode (TE) and a lower electrode (LE). The metal electrode layers may also be referred to as a top electrode (TE) and a lower electrode (LE). In one embodiment, the metal electrode layers that provide the top electrode and the lower electrode are composed of tantalum nitride (TaN). In some embodiments, although tantalum nitride (TaN) may be preferred for the composition of the metal electrode layer, other metallic materials may also be suitable for the metal electrode layer, such as Ti, TiN, Ta, Ru, W, Cr and combinations thereof.

The memory device 300 may also include at least one sidewall spacer 8, 9. In some embodiments, the at least on sidewall spacer 8, 9 includes an interior sidewall spacer 8 that is in direct contact with the sidewall of the memory device 300, and a hanging exterior sidewall spacer 9 that is present on the interior sidewall spacer 8. The interior sidewall spacer 8 may be composed of a nitride, such as silicon nitride. The hanging exterior sidewall spacer 9 may be composed of a nitride, such as silicon nitride, or an oxide, such as silicon oxide.

Still referring to FIGS. 2A-2C, an intralevel dielectric layer 7 may encapsulate a majority of the vertical stack of the memory device 200 overlying the first transistor 100. The intralevel dielectric layer 7 is similar to the interlevel dielectric layer 2. Therefore, the description of the interlevel dielectric layer 2 may provide at least one composition for the intralevel dielectric layer 7. The upper surface of the intralevel dielectric layer 2 may be coplanar with the upper surface of the memory device 200.

Referring to FIGS. 2A-2C, in some embodiments, the second transistor 300 may be composed of a crystalline semiconductor material that is directly atop a metal surface of the memory device 200. The metal surface of the memory device 200 that is in direct contact with the second transistor 300 may be a top electrode (TE) to a magnetic tunnel junction (MTJ) of the memory device 200. The second transistor 300 is similar to the first transistor 100. For example, the second transistor 300 may be a vertical field effect transistor (VFET). The vertical field effect transistor (VFET) of the second transistor 300 may include a first source/drain region 301 that is present in direct contact with the memory device 200, a channel region 302 that is present in direct contact with the first source/drain region 301, and a second source/drain region 303 that is present in direct contact with the channel region 302. A gate structure 304 is present on the channel region 302 of the second transistor 302. Similar to the gate structure 104 of the first transistor 100, the gate structure 304 of the second transistor 300 can include at least one gate dielectric 305 and at least one gate electrode 306.

As noted above, the second transistor 300 is similar to the first transistor 100. Therefore, the description of the components, e.g., the first source/drain region 101, the channel region 102, the second source/drain region 103, and the gate structure 104, of the first transistor 100 can provide the description for some embodiments of the components, e.g., the first source/drain region 301, the channel region 302, the second source/drain region 303 and the gate structure 304, of the second transistor 300.

For example, similar to the first source/drain region 101 of the first transistor 100, the first source/drain region 301 of the second transistor 300 may be composed of a type IV semiconductor material or type III-V semiconductor material that has a recrystallized crystalline structure. The recrystallized crystalline structure may be provided by annealing an amorphous semiconductor material to convert the amorphous crystalline structure to a crystalline crystal structure. For example, the recrystallized crystalline structure for the first source/drain region 301 of the first transistor 300 may be a single crystal crystalline structure or a polycrystalline crystal structure.

In some embodiments, forming the recrystallized semiconductor material for the first transistor 300 may include forming an amorphous semiconductor material on a metal surface, e.g., the top electrode (TE) or the fixed magnetization layer 203, of the memory device 200, wherein after being formed the amorphous semiconductor material is converted to a crystalline crystal structure using an annealing process.

Similar to the thermal budget of the anneal to recrystallize the originally deposited amorphous material for the first source/drain region 101 of the first transistor 100 being selected to avoid adversely affecting or substantially degrading the performance of the metal layer 5, e.g., select layer (SL), the thermal budget of the anneal for converting the deposited amorphous material for the first source/drain region 301 of the second transistor 300 is selected to convert the amorphous material to a crystalline crystal structure without adversely affecting or substantially degrading the performance of the memory device 200 that the second transistor 300 is present thereon.

For example, when the memory device 200 includes a metal layer of copper (Cu), e.g., electrode of copper, the thermal budget for the anneal process for converting the amorphous semiconductor material of the first source/drain region 301 of the first transistor 300 to a crystalline crystal structure is selected to not degrade, e.g., melt, the copper material of the electrode in the memory device 200.

For example, when the memory device 200 includes at least one of a fixed magnetization layer 203 and a free magnetization layer 201 formed of CoFeB or CoFe, the thermal budget for the anneal process for converting the amorphous semiconductor material of the first source/drain region 301 of the second transistor 300 to a crystalline crystal structure is selected to not degrade, e.g., melt, the CoFeB or CoFe material in the memory device 200.

The recrystallization process used to provide the recrystallized first source/drain region 30 of the second transistor 300 may be a laser anneal, or other process having a similar thermal budget, that does not damage the underlying memory device 200. As will be described in further detail below, the recrystallization process may be a laser anneal having a nanosecond duration and a temperature of 1150° C.

In some embodiments, the first source/drain region 301 of the second transistor 300 is recrystallized to provide a polycrystalline crystal structure, such as polysilicon. The first source/drain region 301 is also doped to provide the channel type, e.g., n-channel or p-channel, of the second transistor 300.

Referring to FIGS. 2A-2C, similar to the first transistor 100, the second transistor 300 further includes a channel region 302 and a second source/drain region 303, which may each be composed of an epitaxial material or non-epitaxial material. The forming process for forming each of the channel region 302 and the second source/drain region 303 for the second transistor 301 has a thermal budget that does not damage the underlying memory device line 5.

Each of the channel region 302 and the second source/drain region 303 may be composed of a type IV semiconductor material, such as a silicon containing material, e.g., silicon (Si), or a type III-V semiconductor material. In the embodiments, in which the channel region 302 and the source/drain region 303 of the second transistor 300 is formed using an epitaxial forming method, the crystalline structure for the semiconductor material of the channel region 302 and the source/drain region 303 may be crystalline, e.g., polycrystalline or single crystal crystalline. In one example, each of the channel region 302 and the second source/drain region 303 may be composed of polysilicon. In the embodiments, in which the channel region 302 and the source/drain region 303 of the second transistor 300 is formed using a non-epitaxial forming method, the crystalline structure for the semiconductor material of the channel region 302 and the source/drain region 303 may be amorphous, microcrystalline, nanocrystalline or a combination thereof.

The channel region 302 of the second transistor 300 is present atop, i.e., vertically stacked on, the first source/drain region 301. The channel region 302 may be composed of a base semiconductor composition that is the same or different from the first source/drain region 101. For example, the channel region 302 may be composed of a silicon-containing material, e.g., silicon (Si). The channel region 302 may be intrinsic or may be lightly doped with an opposite conductivity type dopant as the first source/drain region 301 and the second source/drain region 303.

The second source/drain region 303 is present atop, i.e., vertically stacked on, the channel region 302 of the second transistor 300. The second source/drain region 303 of the second transistor 300 may be composed of a base semiconductor composition that is the same or different from the first source/drain region 301 of the second transistor. The second source/drain region 303 may be doped to the same conductivity type as the first source/drain region 301. For example, if the first source/drain region 301 is doped to an n-type conductivity, the second source/drain region 303 is doped to an n-type conductivity.

Referring to FIGS. 2A-2C, similar to the first transistor 100, the second transistor 300 includes a gate structure 304 having a gate dielectric 305 and a gate electrode 306. The descriptions of the gate dielectric 105 and the gate electrode 105 of the first gate structure 104 are suitable for providing the description of at least one embodiment of the gate dielectric 305 and gate electrode 306 for the gate structure 304 of the second transistor 300. For example, the gate dielectric 305 may be a high k material, such as hafnium oxide ($HfO_2$). For example, the gate electrode 306 for the second transistor 300 may be composed of a metal, such as a high work function metal and/or a low work function metal. In some other embodiments, the gate electrode (also referred to as gate conductor) 306 may be composed of doped semiconductor, e.g., n-type polysilicon.

The gate structure 304 may be separated from the underlying intralevel dielectric 7, by at least one dielectric layer 10. For example, the at least one dielectric layer 10 may be an oxide, such as silicon oxide ($SiO_2$). In some embodiments, the at least one dielectric layer 10 may be a nitride, such as silicon nitride, or a silicon oxynitride. In some embodiments, the gate structure 304 may further be separated from the underlying interlevel dielectric layer 10 by a horizontally orientated portion of the gate dielectric 305 that extends between a lower face of the gate electrode 306 and the at least one dielectric layer 10.

Still referring to FIGS. 2A-2C, an intralevel dielectric layer 11 may encapsulate a majority of the second transistor 300. The intralevel dielectric layer 11 is similar to the interlevel dielectric layer 2. Therefore, the description of the interlevel dielectric layer 2 may provide at least one composition for the intralevel dielectric layer 11. The upper surface of the intralevel dielectric layer 11 may be coplanar with the upper surface of the second transistor 300.

The gate electrode 306 of the gate structure 304 for the second electrode 300 may be in electrical communication with a metal line 12, e.g., bit line (BL). In some embodiments, the memory cells, e.g., the two transistor (2T)-one memory device (1MTJ) bit-cell, e.g., (2T-1MJT) bit-cell, are positioned in an array of columns (bit lines) and rows (word lines), as depicted in FIG. 2A. The intersection of a bit line (BL) and a word (WL) line constitutes the address of the memory cell. In some embodiments, the metal line 12 that provides the bit line (BL) is composed of an electrically conductive material, such as a metal or metal containing material, e.g., copper (Cu), aluminum (Al), tungsten (W), tungsten nitride (WN), titanium (Ti), titanium nitride (TiN), and combinations thereof.

The annealing process for forming the crystalline phase for the second vertical semiconductor device does not adversely impact the performance of the underlying memory device 300. For example, the annealing process can be employed without significantly impacting the electromagnetic properties, e.g., changing the magnetoresistance, of the memory device 300. For example, following annealing of the second vertical semiconductor device using the laser anneal process that is described herein, the magnetic resistance of the memory device is substantially the same after the anneal as it was before the anneal. By "substantially" when describing before anneal and after anneal magnetoresistance, it is meant that any change in the magnetoresistance in the memory device 300 that results from the annealing described herein is 5% or less, i.e., less than a 5% delta of the magnetoresistance when comparing the magnetoresistance of the memory device 300 before annealing to the magneto resistance of the memory device 300 after the annealing. In one example, the memory device 300 can have a given magnetoresistance of 50% or greater following application of a nanosecond laser anneal having a temperature of up to 1150° C. applied to the second transistor 300 to provide the crystal structure for the crystalline semiconductor material.

The embodiments of FIGS. 2A-2C illustrate one layer of a memory array typically referred to as a single-layer or 2 dimensional (2D) memory array. Multiple single-layer memory arrays may be fabricated using the structures and methods described herein and stacked on top of each other to form a multi-layer memory array typically referred to as a three dimensional (3D) memory array. The laser annealing or similar low thermal-budget process used during the fabrication of a memory array, as disclosed herein, does adversely impact or substantially degrade the underlying memory arrays.

One embodiment of a method for forming the electrical device structure depicted in FIGS. 2A-2C is now described with reference to FIGS. 3-11B. Therefore, the description for the structures depicted in FIGS. 3A-11B having reference numbers that match the reference numbers for the structures depicted in FIGS. 2A-2C is a further description of the structures having the same reference numbers in FIGS. 2A-2C.

Figure 3:
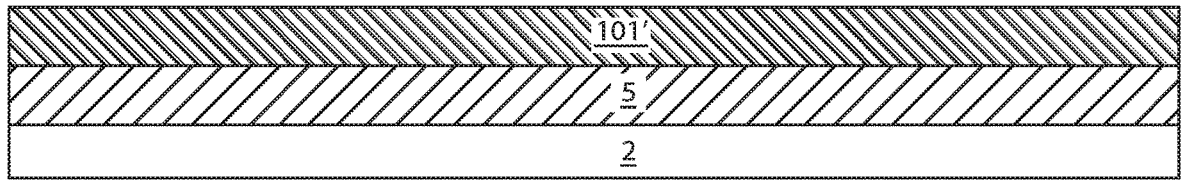
FIG. 3 is a side cross-sectional view of a layer of amorphous semiconductor material atop a select line that is overlying an interlevel dielectric layer (ILD) as used in one embodiment of a method for forming the structure depicted in FIGS. 2A-2C.

FIG. 3 depicts a layer of amorphous semiconductor material 101' atop a select line SL (also referred to as metal line 5) that is overlying an interlevel dielectric layer (ILD) 2 as used in one embodiment of a method for forming the structure depicted in FIGS. 2A-2C. The layer of amorphous semiconductor material 101' is processed to provide the first source/drain region 101 of the first transistor 100. Therefore, the compositions and conductivity types described above for the first source/drain region 101 is applicable for describing the amorphous semiconductor material 101'. As will be described herein, the amorphous semiconductor material 101' is first deposited with an amorphous crystal structure and is then crystallized using a low thermal budget process, such as laser annealing, to have a crystalline crystal structure, e.g., polycrystalline, without degrading the underlying metal line 5 (also referred to as select line SL).

The metal lines 5 may be formed using deposition processes in combination with photolithography and etching. Deposition process for forming the metal lines can include physical vapor deposition (PVD), e.g., sputtering; plating, e.g., electroplating and/or electroless plating; chemical vapor deposition (CVD); and other type deposition processes. The metal lines 5 may be formed into dielectric layers, e.g., the interlevel dielectric layer 2. The upper surface of the metal lines 5 can be planarized by chemical vapor deposition.

The amorphous semiconductor material 101' may then be deposited atop the metal lines. The term "amorphous" denotes a solid that lacks the long-range order that is characteristic of a crystal. As used herein, "depositing" can include techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), atomic layer deposition (ALD), molecular beam epitaxy (MBE), evaporation, and combinations thereof. In one embodiment, the amorphous semiconductor material 101' is amorphous silicon (Si). To provide the conductivity type of the first source/drain region 101, the amorphous semiconductor material 101' may be in-situ doped or doped by ion implantation.

Figure 4:
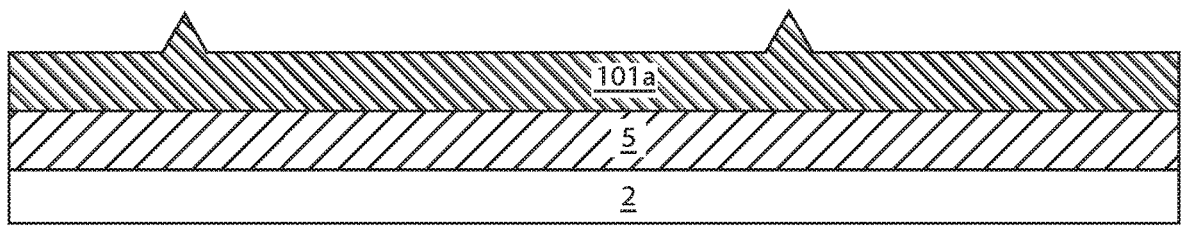
FIG. 4 is a side cross-sectional view depicting converting the amorphous semiconductor material to a crystalline semiconductor material using a laser anneal, in accordance with one embodiment of the present disclosure.

FIG. 4 depicts one embodiment of converting the amorphous semiconductor material 101' to a crystalline semiconductor material 101a. In one embodiment, the amorphous semiconductor material is converted to a crystalline crystal structure, such as a polycrystalline crystal structure, with a laser anneal having a nanosecond duration.

In some embodiments, the laser anneal process may be applied to the amorphous semiconductor material 101' to crystallize the doped amorphous semiconductor material to form doped crystallized crystalline semiconductor material 101a. The laser crystallization process may include melting of the amorphous material followed by solidification into a crystalline material. The melting may include partial melting, or full melting.

As used herein, the term "laser annealing" denotes an annealing method that employs a laser to induce heat in the surface being treated. A laser is an electronic-optical device that emits coherent radiation. In some embodiments, a typical laser emits light in a narrow, low-divergence beam and with a defined wavelength. In some instances, the advantages of employing laser for annealing processes is that its light can be easily shaped and focused onto a specific area of the substrate achieving very high radiation intensity with short exposure durations. This can provide for a localized substrate heating to a target high temperature with very short durations. In some embodiments, the short exposure duration is achieved by raster scanning focused laser beam over the surface to be annealed. In this case, the exposure duration measured at half of the incident intensity is the beam width in the scanning direction divided by the scanning velocity. In alternative embodiments, the short exposure duration is achieved by employing a pulsed laser.

In some embodiments, selecting laser wavelength that is shorter than the band gap absorption edge of amorphous semiconductor material 101' allows for an efficient absorption of radiation by these materials. The bang gap absorption edge for silicon is 1100 nm. In some embodiments, the laser type with longer emitting wavelength that is employed in the laser annealing method is selected from a far-infrared $CO_2$ laser emitting at 10600 nm, a solid-state Nd:YAG laser emitting at 1064 nm, or a solid-state laser diode array emitting in a 780 nm-1000 nm band. In some embodiments, the laser type with shorter emitting wavelength that is employed in the laser annealing method is selected from an excimer laser emitting at below 400 nm, a frequency-doubled or -tripled solid-state Nd:YAG laser emitting at 532 nm or 355 nm, respectively, or a solid-state laser diode array emitting at below 1000 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds (ArF (193 nm), KrCl (222 nm), KrF (248 nm), XeCl (308 nm), and XeF (351 nm)). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation.

Some examples of laser annealing systems that can produce the anneal temperatures and nanosecond-scale anneal durations that are suitable for converting, e.g., melting and crystallizing, the doped amorphous semiconductor material 101' into doped crystalline semiconductor material 101a include nanosecond laser melting systems based on Q-switched solid-state Nd:YAG lasers or XeCl excimer lasers or dual-beam laser melting systems based on a Pt scanning laser beam with nanosecond-scale substrate exposure based on continuous-wave solid-state Nd:YAG lasers and a 2nd scanning laser beam with millisecond-scale substrate exposure based on continuous-wave solid-state laser diode arrays emitting in a 780 nm-1000 nm.

In some embodiments, the anneal temperature to crystallize, or melt and crystallize, the doped amorphous semiconductor material 101' to form doped crystalline semiconductor material 101a ranges from 650° C. to 1200° C. In other examples, the anneal temperature to crystallize, or melt and crystallize, the doped amorphous semiconductor material 101' to form doped crystalline semiconductor material 101a is equal to 650° C., 700° C., 750° C., 800° C., 850° C., 900° C., 950° C., 1000° C., 1050° C., 1100° C., 1150° C., and 1200° C., as well as any range having an upper limit and a lower limit provided by one of the aforementioned examples. In one example, doped amorphous semiconductor material 101' composed of silicon (Si) crystallizes at around 1000° C. in nanosecond anneal to provide polycrystalline silicon. In one example, the laser annealing for converting the amorphous semiconductor material 101' may be at a temperature of up to 1150° C. In some embodiments, the laser anneal process produces spikes on the upper surface of the crystalline semiconductor material 101a. To provide a planar upper surface, and to remove the spacers, the crystalline semiconductor material 101a is planarized, e.g., by chemical mechanical planarization (CMP).

In one example, an excimer laser with an energy density (fluence) in the range of 350-450 mJ/cm$^2$, laser pulse width is in the range of 10-50 ns and the repetition rate is in the range of 100 Hz-1 KHz is used for crystallization of amorphous Si into poly-crystalline Si. The number of laser pulses (shots) may be in range of 1-100, but a larger number of pulses may also be used. In embodiments where a-Si contains volatile elements such as H, Ar and He, a low-temperature thermal treatment (e.g. furnace anneal at 400° C.) or low-energy laser treatment (e.g. with fluence below 300 mJ/cm$^2$) may be performed before laser crystallization to substantially reduce the concentration of these elements (e.g. to lower than 1%) in order to avoid explosive release of these elements (and therefore formation of voids) during laser crystallization. The short laser pulses allow sufficient time for the thermal dissipation of the locally generated heat, allowing the underlying layers (e.g. copper interconnects and logic devices below the ILD layer 2) to maintain low temperatures (e.g. below 400° C.) during laser crystallization. In some embodiments, substrate cooling may be performed optionally during laser crystallization, for instance, by placing the wafer on a heat-sink or a water-cooled holder during laser crystallization.

In one embodiment, the doped crystalline semiconductor material 101a is polycrystalline material, such as polysilicon. In one embodiment, the doped crystalline semiconductor material 101a is polycrystalline silicon doped with antimony (Sb). In another embodiment, the doped crystalline semiconductor material 101a is polycrystalline silicon doped with gallium (Ga).

In a following sequence, the method can continue with forming a channel material layer 102a for the channel region 102 using an epitaxial deposition process atop the crystalline semiconductor material 101a and forming an upper source/drain material layer 103a for the second source/drain region 103 for the first transistor 100 (also referred to as lower transistor).

In some embodiments, the channel material layer 102a and the upper source/drain material layer 103a may be deposited by low temperature epitaxial processes. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth.

In some embodiments, the channel material layer 102a and the upper source/drain material layer 103a may be deposited by low temperature epitaxial processes. By low temperature, it is meant that the maximum temperature is no greater than 500° C. The low temperature processing may be selected to provide an epitaxial material without adversely impacting the underlying material layers. In some examples, the epitaxial deposition process may provide a channel material layer 102a and an upper source/drain material layer 103a composed of a semiconductor material having a polycrystalline crystal structure, such as polysilicon. In particularly useful embodiments, growth temperatures in the range of 150–450° C. are achieved using plasma enhanced chemical vapor deposition (PECVD). The epitaxial growth is obtained by increasing and optimizing a carrier gas (e.g. $H_2$) to precursor gas (e.g. $SiH_4$) ratio of e.g. $[H_2]/[SiH_4]$. In one example, an N+ doped silicon is grown using low temperature epitaxy by, e.g., incorporating phosphorus using phosphine ($PH_3$) gas.

In one embodiment, the low temperature epitaxial growth of silicon is performed in a hydrogen diluted silane environment using a plasma enhanced chemical vapor deposition process (PECVD). The gas ratio of hydrogen gas to silane gas ($[H_2]/[SiH_4]$) at 150-450° C. is between 1 and 1000. In some other embodiments, epitaxially growth of silicon begins at a gas ratio of about 5-10. The epitaxial Si quality is improved by increasing the hydrogen dilution, e.g., to 5 or greater. Epitaxial silicon can be grown at low temperature using various gas sources, e.g., silane ($SiH_4$), dichlorosilane (DCS), $SiF_4$, $SiCl_4$ or the like. Radio-frequency (RF) or direct current (DC) plasma enhanced chemical vapor deposition (CVD) can be performed at deposition temperature ranging from about room temperature, e.g., 20° C. to 25° C., to about 500° C. In some examples, the low temperature epitaxial process may have a deposition temperature ranging from 150° C. to 250° C. Plasma power density may range from about 2 mW/cm$^2$ to about 2000 mW/cm$^2$. A deposition pressure range may be from about 10 mtorr to about 5 torr. An optional laser treatment step may be performed in some embodiments to improve the crystallinity (e.g. reduce the crystal defects) and/or increase doping activation of the epitaxial layer. Other treatments such as, e.g. rapid thermal annealing (RTA), forming gas anneal (FGA) and flash lamp anneal, may also be optionally used.

In other embodiments, the channel material layer 102a and the upper source/drain material layer 103a may be deposited by non-epitaxial deposition processed, wherein the channel material layer 102a and the upper source/drain material layer 103a may be composed of non-crystalline semiconductor material, such as amorphous semiconductor material, microcrystalline semiconductor material and/or nanocrystalline semiconductor material. In one example, non-epitaxial deposition process may chemical vapor deposition (CVD) processes and/or atomic layer deposition (ALD). In yet other embodiments, similar to how the amorphous semiconductor material 101' is converted into doped crystalline semiconductor material 101a, the non-crystalline semiconductor material deposited by non-epitaxial processes may be converted to crystalline material using the above described low temperature laser annealing process that employs a nanosecond duration. In one example, the non-crystalline semiconductor is comprised of amorphous silicon grown by PECVD with gas ratio of hydrogen gas to silane gas ($[H_2]/[SiH_4]$) below 5, at temperatures ranging from 150° C.-450° C.

Figure 5:
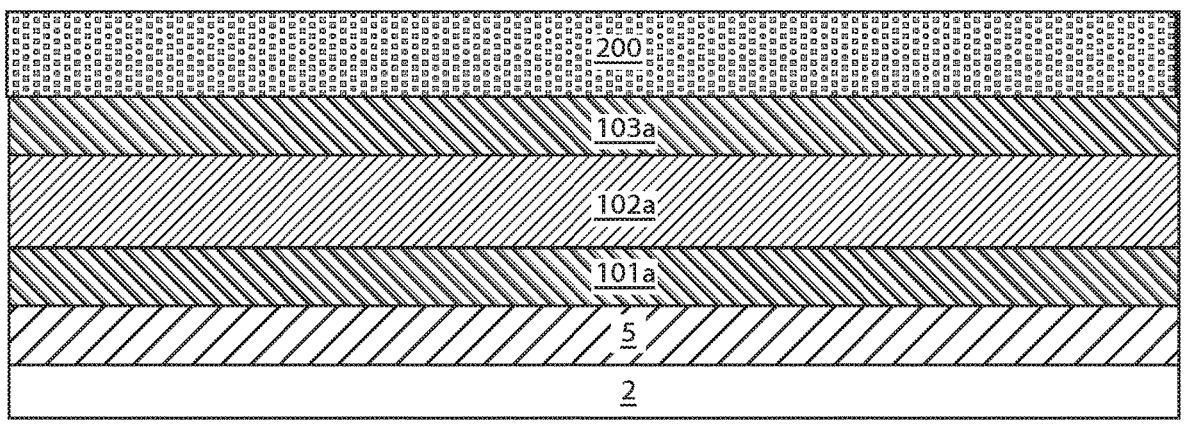
FIG. 5 is a side cross-sectional view depicting forming a channel material layer and upper source/drain material layer for the first transistor (also referred to as lower transistor), and forming the material stack for a memory device, in accordance to one embodiment of the present disclosure.

FIG. 5 also depicts forming the material stack 200a for the memory device 200. The memory stack 200a may include material layers for forming a magnetic random access memory (MRAM) device, a phase change memory (PCM) device, and/or a resistive random access (RRAM) device. The memory device depicted in FIGS. 2A-2C is an MTJ memory device including material layers for a free magnetization layer 201, a tunnel junction dielectric layer 202, and a fixed magnetization layer 203. Each of the fixed magnetization layer 203 and the free magnetization layer 201 may be composed of a ferromagnetic material that can be deposited using a plating process, such as electroplating and/or electroless deposition, a physical vapor deposition (PVD) process, such as sputtering, a chemical vapor deposition (CVD) process, such as metal organic chemical vapor deposition (MOCVD) or plasma enhanced chemical vapor deposition (PECVD), and/or atomic layer deposition (ALD).

Figure 6A:
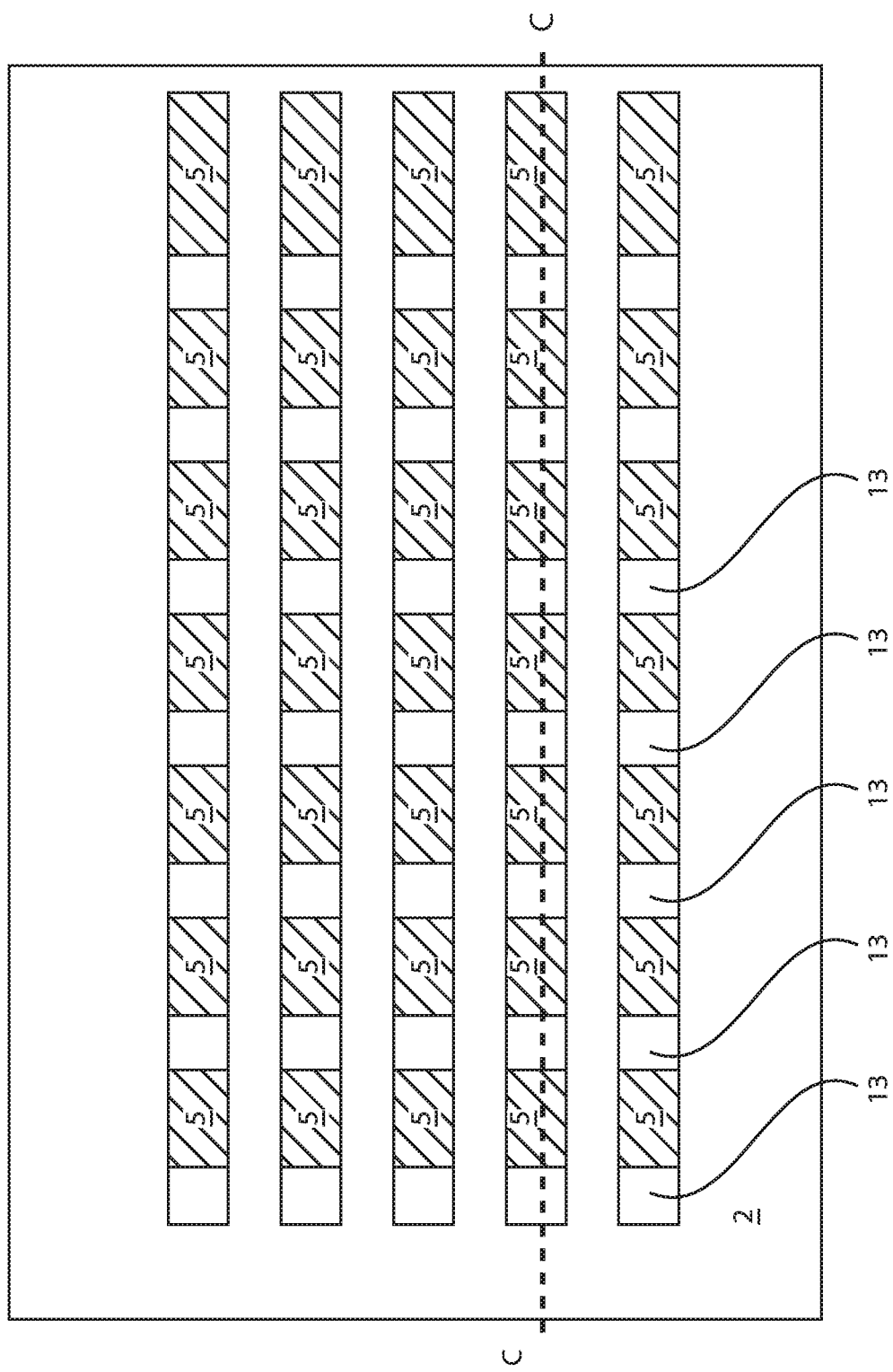
FIG. 6A is a top down view depicting one embodiment of patterning and etching the material stack that is depicted in FIG. 5 into pillars atop the select line.
Figure 6B:
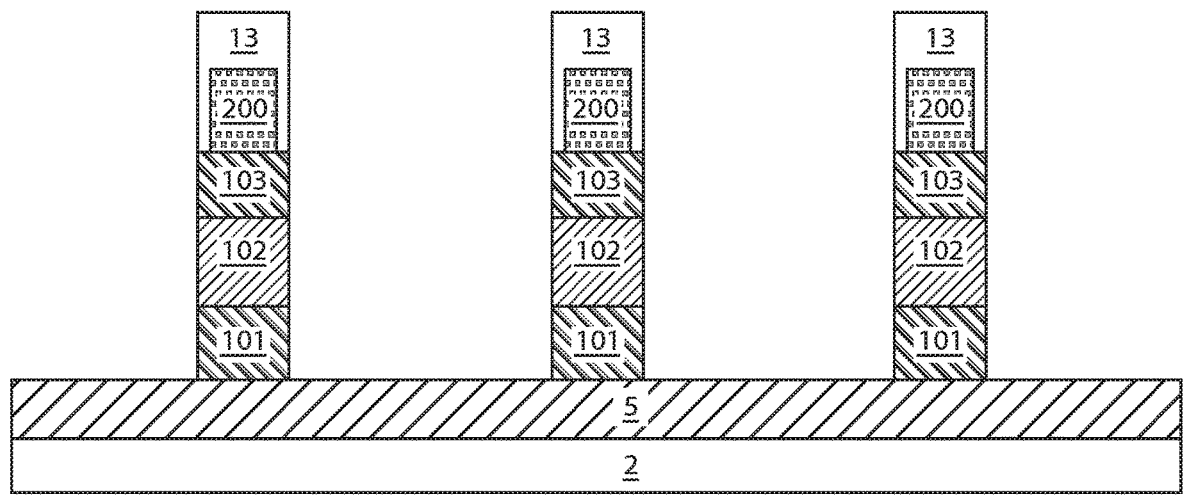
FIG. 6B is a side cross-sectional view along section line C-C of FIG. 6A.

FIGS. 6A-6C depict one embodiment of patterning and etching the material stack that is depicted in FIG. 5 into pillars atop the metal line 4, e.g., select line SL. In one embodiment, forming the pillars may begin with patterning and etching the memory stack 200a to define the memory device 200. The patterning step for defining the memory device 200 may include forming a photoresist mask on the memory stack 200a using photolithography. Etching the memory stack 200a using the photoresist mask as an etch mask can employ an anisotropic etch, such as reactive ion etching (RIE). In a following step, an encapsulating memory spacer 13 composed of a dielectric material is formed on the memory device 200 and planarized, e.g., by chemical mechanical planarization (CMP). In one example, the dielectric material for the encapsulating memory spacer 13 is a nitride, such as silicon nitride. In some embodiments, the material layer for the encapsulating memory spacer 13 may be etched using a photoresist mask to provide a cap structure containing the memory device 200. The etch process may be continued extending through each of the upper source/drain material layer 103a, the channel material layer 102a and the crystalline semiconductor material 101a stopping on the metal line 5, e.g., the select line SL. The etch process may be an anisotropic etch, such as reactive ion etching (RIE). In this example, the metal line 5 may provide a common electrode for all the cells. In another embodiment, the etch process may continue with patterning the metal line 5, the select line SL.

Figure 7:
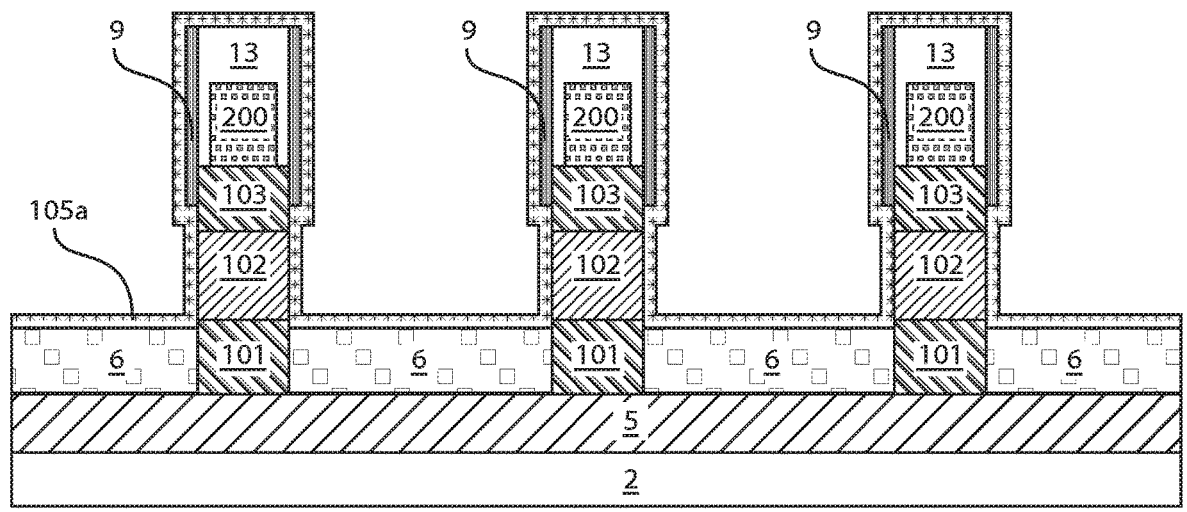
FIG. 7 is a side cross-sectional view depicting one embodiment of forming at least one spacer on the stack for the memory device, forming at least one dielectric layer for a spacer on the select line, and forming a conformal dielectric layer for a gate dielectric of a gate structure.

FIG. 7 depicts forming at least one dielectric layer 6 for a spacer on the metal line 5, e.g., select line (SL). The at least one dielectric layer 6 has a height that dictates the positioning of the gate structure to be aligned with the channel region 102 of the first transistor 100 (also referred to as lower transistor). The at least one dielectric layer 6 may be composed of a flowable dielectric, e.g., flowable oxide. The at least one dielectric layer 6 may be deposited using a deposition process, such as spin on deposition, deposition from solution and/or chemical vapor deposition (CVD). An etch process, such as reactive ion etch (RIE), may be used to reduce the height of the deposited material for the at least one dielectric layer 6.

FIG. 7 also depicts one embodiment of forming at least one spacer, e.g., hanging exterior sidewall spacer 9, on the stack for the memory device 200. The hanging exterior sidewall spacer 9 may be formed by depositing a sacrificial spacer having a thickness to determine the height of the lower surface of the hanging exterior sidewall spacer 9. A conformal deposition process may then deposit a dielectric material layer for the hanging exterior sidewall spacer 9. Following deposition of the conformal layer, an etch back process, such as an anisotropic etch, e.g., reactive ion etch (RIE), may remove the horizontally orientated portions of the conformal layer, wherein the vertically orientated portions of the conformal layer in their majority remain to provide the hanging exterior sidewall spacer 9. Thereafter, the sacrificial spacer is removed. FIG. 7 also depicts forming a conformal dielectric layer 105a for a gate dielectric 105 of a gate structure. The conformal dielectric layer 105a may be blanket deposited using atomic layer deposition (ALD).

Figure 8:
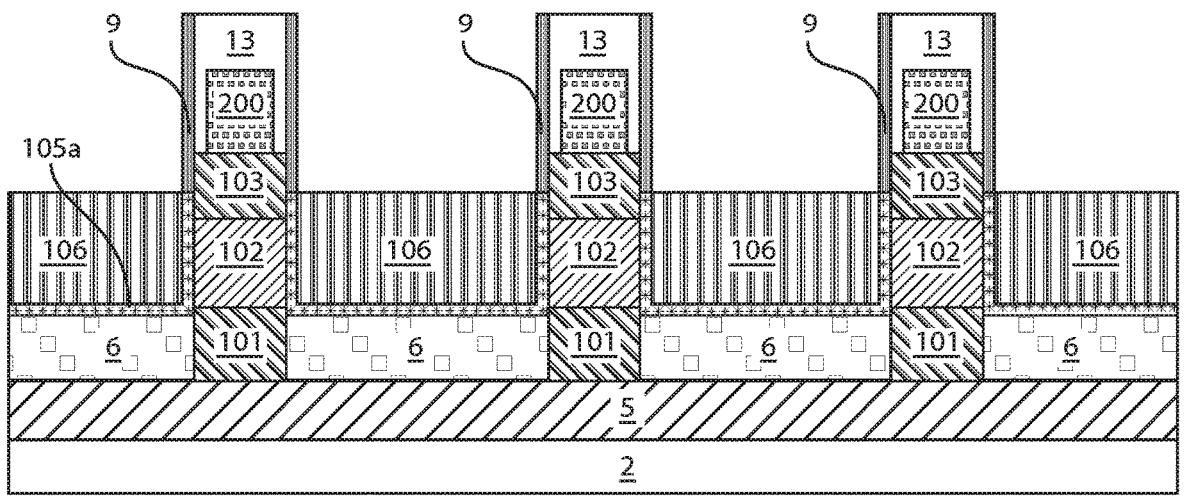
FIG. 8 is a side cross-sectional view depicting forming an electrically conductive material layer for a gate electrode of a gate structure, in accordance with one embodiment of the present disclosure.

FIG. 8 depicts forming the gate electrode 106 of the gate structure. The material layer for the gate electrode 106 may be deposited on the conformal dielectric layer 105a using a deposition process, such as plating, e.g., electroplating and/or electroless pacer, physical vapor deposition (PVD), e.g., sputtering, and/or chemical vapor deposition (CVD). Following deposition, the material layer for the gate electrode 106 may be planarized, e.g., planarized by chemical mechanical planarization (CMP), to be coplanar with the upper surface of the encapsulating memory spacer 13. In a following process step, an etch process, such as an anisotropic etch process, e.g., reactive ion etching (RIE), can be used to recess the portions of the conformal dielectric layer for the gate dielectric 105, and to recess the material layer for the electrode, as depicted in FIG. 8.

Figure 9A:
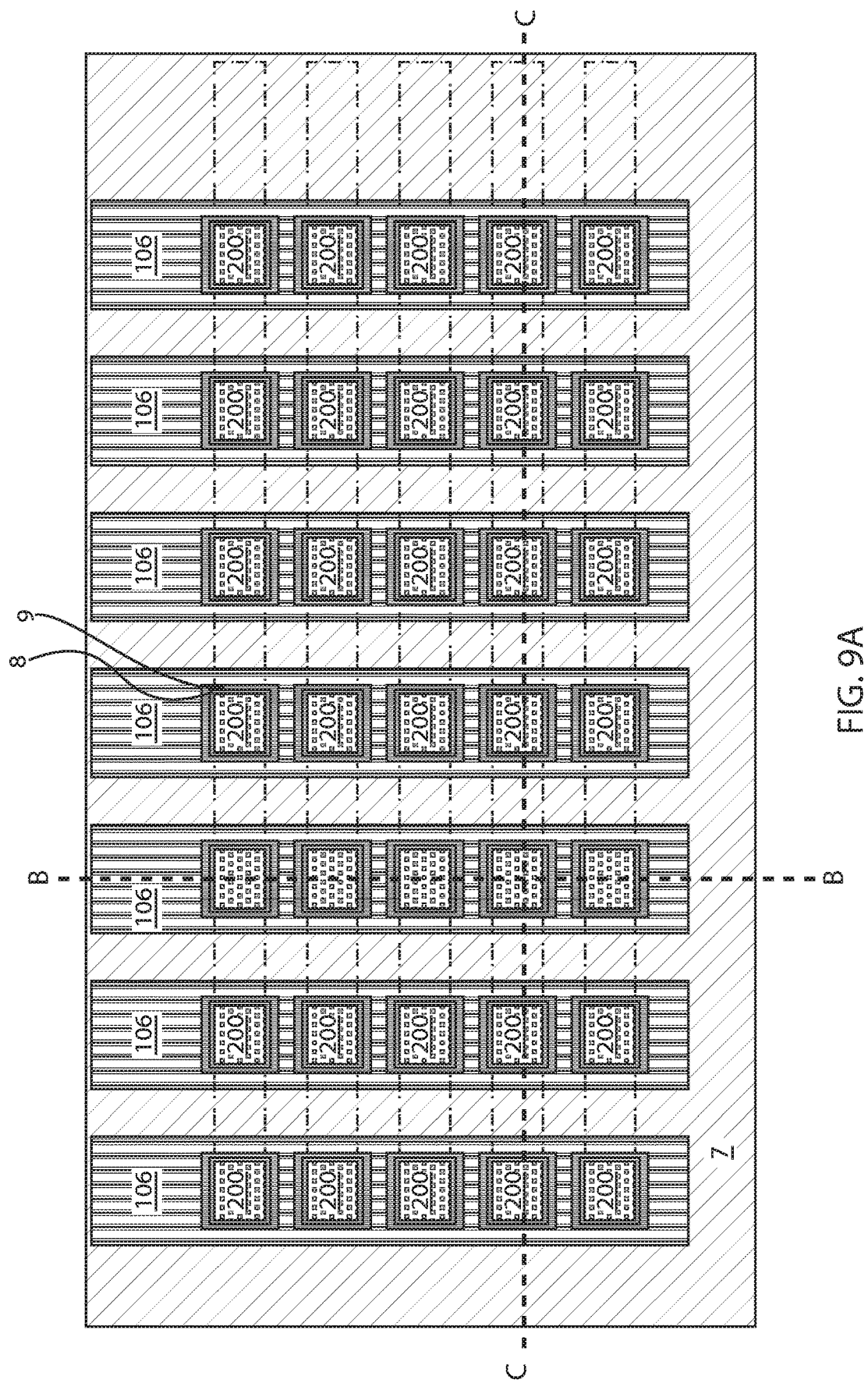
FIG. 9A is a top down view depicting forming one embodiment of patterning the conformal dielectric layer and the electrically conductive material layer to provide gate structures, and depositing an intralevel dielectric layer having an upper surface coplanar with the memory device.
Figure 9B:
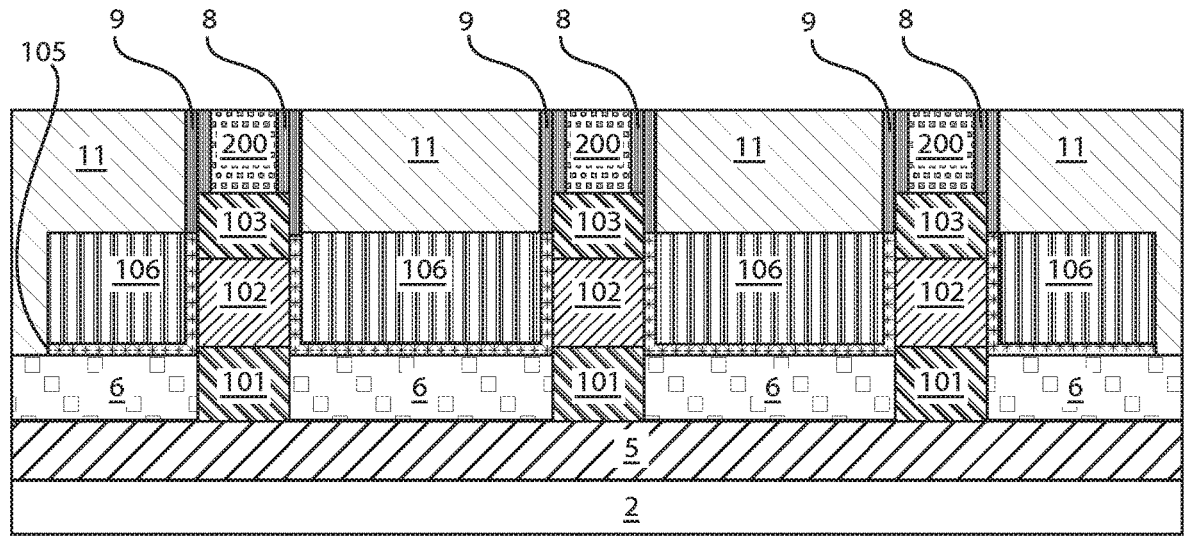
FIG. 9B is a side cross-sectional view along section line B-B of FIG. 9A.
Figure 9C:
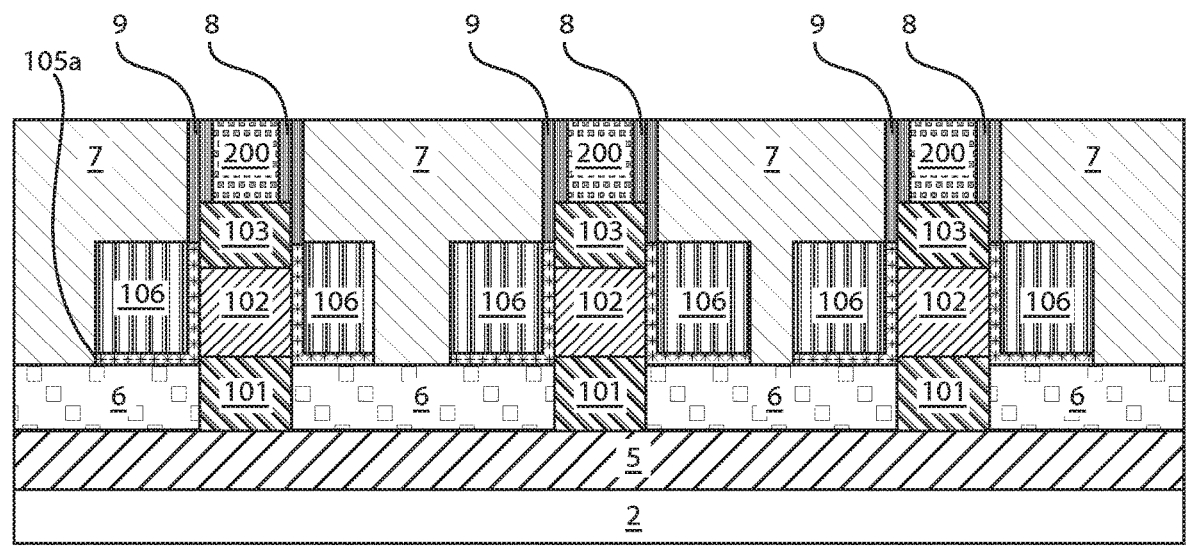
FIG. 9C is a side cross-sectional view along section line C-C of FIG. 9A.
Figure 10A:
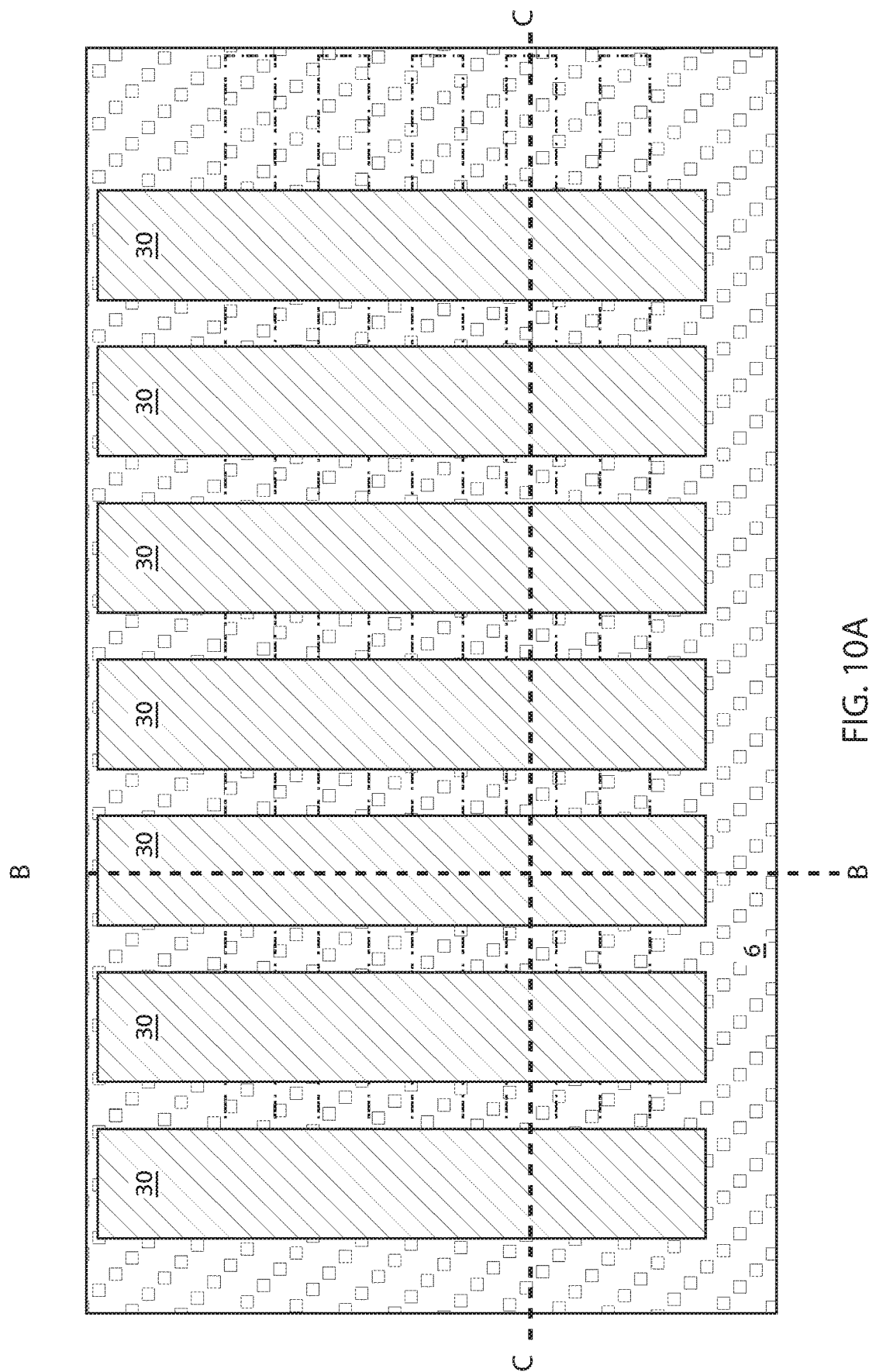
FIG. 10A is a top down view depicting forming a hardmask on the structure depicted in FIG. 9A, in which the hardmask is used to pattern a metal layer for a word line, in accordance with one embodiment of the present disclosure.
Figure 10B:
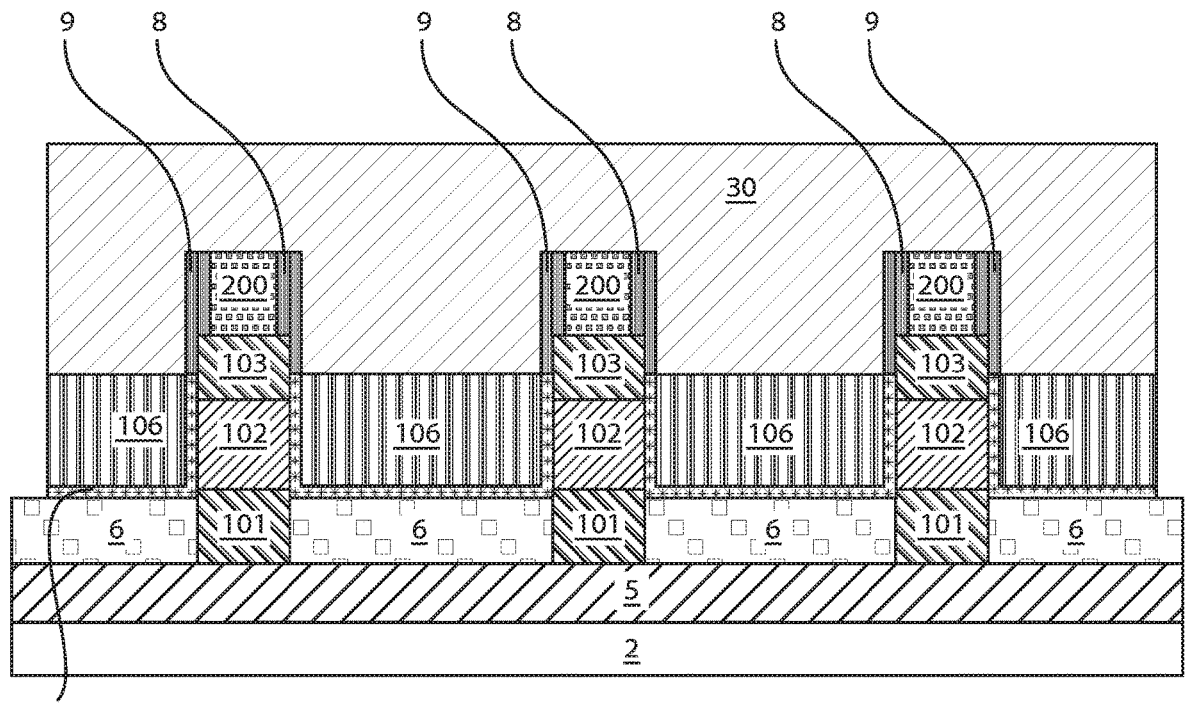
FIG. 10B is a side cross-sectional view along section line B-B of FIG. 10A.
Figure 10C:
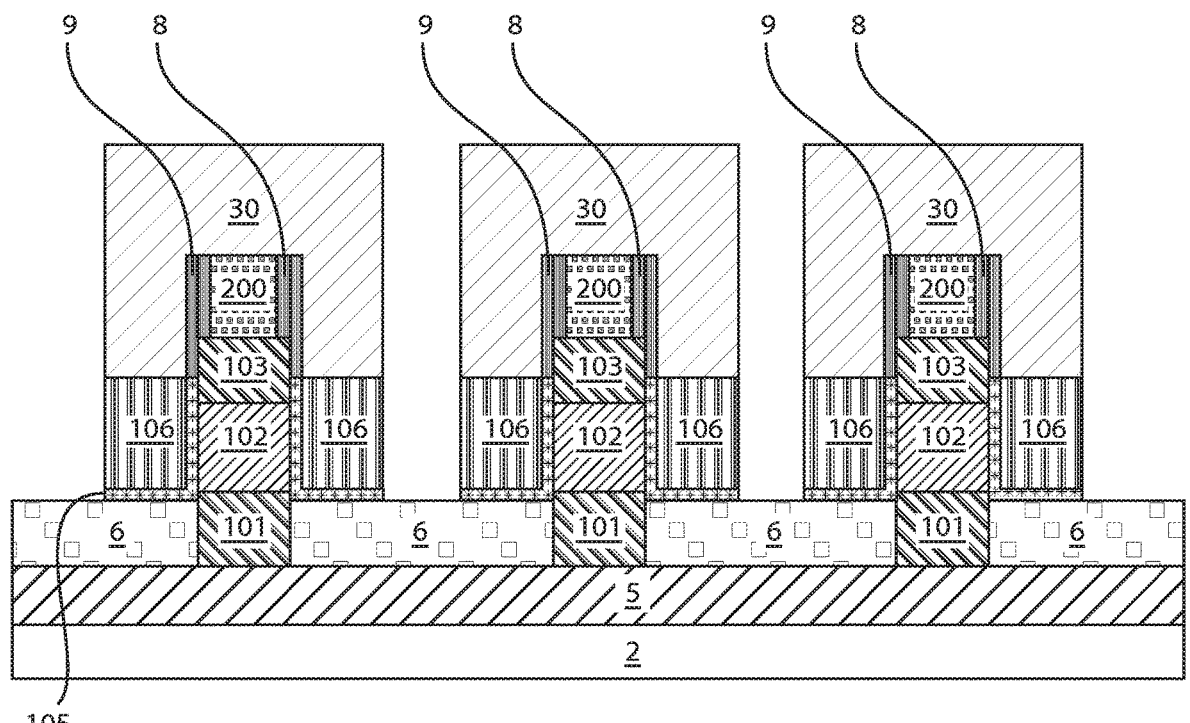
FIG. 10C is a side cross-sectional view along section line C-C of FIG. 10A.

FIGS. 9A-9C depict one embodiment of patterning the conformal dielectric layer for the gate dielectric 105, and the electrically conductive material layer for the gate electrode 106 to provide gate structures, and depositing an intralevel dielectric layer 7 having an upper surface coplanar with the memory device 200. The gate structures may be defined by forming an etch mask, such as an etch mask that is provided by a hardmask 30, and etching the portions of the conformal dielectric layer for the gate dielectric 105, and the electrically conductive material layer for the gate electrode 106 to define the gate structures, as depicted in FIGS. 10A-10C. The hardmask 30 may then be removed. The intralevel dielectric layer 7 may be deposited by spin on deposition or chemical vapor deposition. A planarization process, such as CMP, may be applied to the intralevel dielectric layer 7 and the upper surface of the encapsulating memory spacer 13 until the upper surface of the memory device 200 is exposed, and is coplanar with the upper surface of the intralevel dielectric layer 7.

Figure 11A:
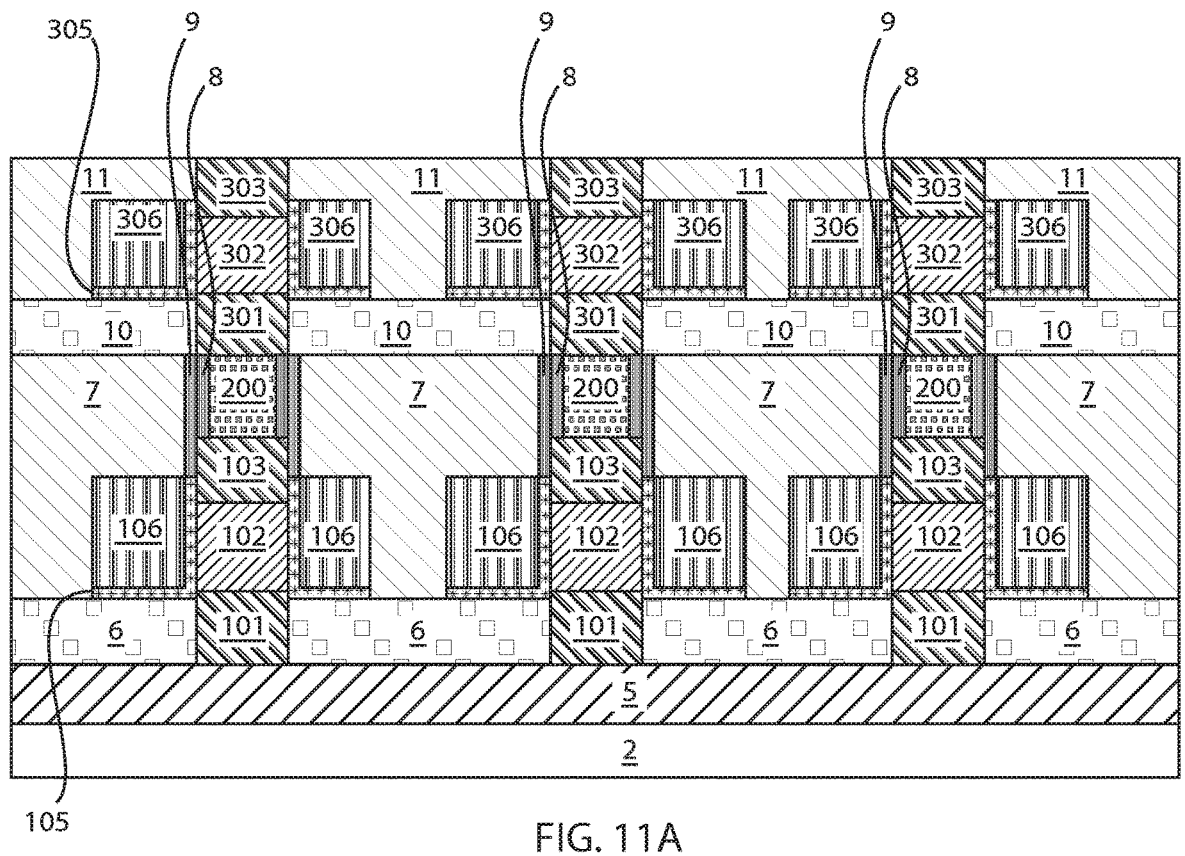
FIG. 11A is a side cross-sectional view along section line B-B of FIG. 2A illustrating forming a second transistor (upper transistor) atop the memory device depicted in FIGS. 10A-10C, in which the second transistor is formed using a crystallization method that does not damage the memory device.
Figure 11B:
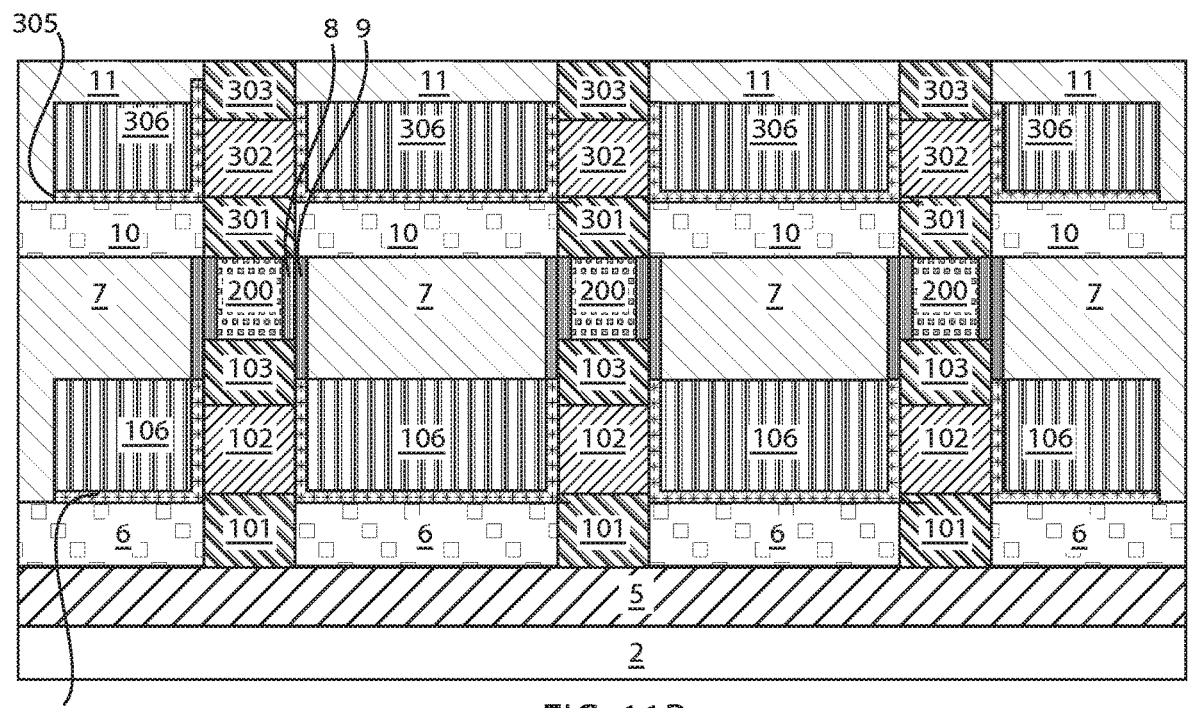
FIG. 11B is a side cross-sectional view along section line C-C of FIG. 2A for the structure depicted in FIG. 11A.

FIGS. 11A-11C depict forming a second transistor 300 (upper transistor) atop the memory device 300 depicted in FIGS. 10A-10C, in which the second transistor 300 is formed using a crystallization method, e.g., low thermal budget laser annealing process, that does not damage the memory device 200. The second transistor 300 is similar to the first transistor 100 that is described being formed with reference to FIGS. 3-10C. Contrary to the first transistor 100 that includes an overlying memory device 200, it is noted that a memory device is not present atop the second transistor 300. However, the description of forming the first transistor 100 can provide one embodiment of forming the second transistor 300.

For example, the first source/drain region 301 of the second transistor 300 may be composed of a crystalline material that was initially deposited with an amorphous crystalline structure, which is converted to a crystalline material using a low thermal budget laser annealing process. The description of the formation of the amorphous semiconductor material 101' depicted in FIG. 3, and the low thermal budged laser anneal conversion of the amorphous semiconductor material to a crystalline semiconductor material 101a depicted in FIG. 4, for providing the material layer for the first source/drain region 101 of the first transistor is applicable for providing at least one embodiment of forming the material layer for the first source/drain region 301 of the second transistor 300. The stacking of the memory bit cell that includes the second transistor 300 being vertically stacked atop the memory device 200, and the memory device being vertically stacked atop the first transistor 100, is enabled by appropriate use of excimer laser annealing to convert low-temperature deposited semiconductors, which have an amorphous crystal structure, into a crystalline crystal structure, such as a polycrystalline crystal structure, without damaging the underlying memory cells, e.g., memory devices 200, and the metallization lines 5, e.g., select line SL.

In a following process step, the material layers for the channel region 302 and the second source/drain region 303, may be deposited atop the material layer for the first source/drain region 301. The material layers for the channel region 302 and the second/source drain region 303 for the second transistor 300 are similar to the channel material layer 102a and the upper source/drain material layer 103a for the first transistor 100, which are described above with reference to FIG. 5. The deposition process steps for forming the channel material layer 102a and the upper source/drain material layer 103a for the first transistor 100, which are described above with reference to FIG. 5, are suitable for describing the formation of the material layers for the channel region 302 and the second/source drain region 303 for the second transistor 300. For example, the material layers for the channel region 302 and the second/source drain region 303 for the second transistor 300 may be formed using low thermal budget processes, such as low temperature epitaxial deposition and/or the laser annealing process, which have been used to describe the formation of equivalent structures depicted in FIGS. 2A and 2B. The temperatures and/or thermal budget of the processes for forming the material layers for the channel region 302 and the second/source drain region 303 for the second transistor 300 are selected to protect the underlying memory device 200 from being damaged. These conditions have been described in FIGS. 3-5.

Following the formation of the material stack of the material layers for the first source/drain region 301, the channel region 302 and the second/source drain region 303 for the second transistor 300, pillars may be formed from the material stack directly overlying memory device 200 so that the lower surface of the first source/drain region 301 is in direct contact with the upper surface of the memory device 200. The pillars may be formed using mask forming technology, such as forming a photoresist mask using photolithography, in combination with anisotropic etching, such as reactive ion etching. Further details for forming the pillars for the second transistor 300 are provided in the description of pillar for the first transistor 100, which is described with reference to FIGS. 6A-6C.

In a following process sequence, forming the second transistor 300 may continue with forming a gate structure composed of the gate dielectric 305 and the gate electrode 306. The description of forming the gate structure for the first transistor 100 is suitable for providing one embodiment of forming the gate structure for the second transistor 300. Forming the gate structure for the first transistor 100 is described with reference to FIGS. 7-9C. The description for forming a gate structure in FIGS. 7-9C is suitable for forming the gate structure for the second transistor 300 including the gate dielectric 305 and the gate electrode 306. Further the description of forming the at least one dielectric layer 6 for determining the positioning of the gate structure of the first transistor 100 is applicable for describing forming the at least one dielectric layer 10 for determining the positioning of the gate structure for the second transistor 300.

Following the formation of the gate structure for the second transistor 300, an intralevel dielectric layer (ILD) 11 is blanket deposited, e.g., by spin on deposition and/or chemical vapor deposition (CVD). The ILD layer 11 is planarized, e.g., by CMP, to expose the upper surface of the second source/drain region 303 of the second transistor 300. A metal line 12, e.g., bit line (BL) may be formed in electrical contact with the second source/drain region 303, as depicted in FIGS. 2A-2C.

The thermal processing of the second transistor 300 using the low thermal budget processes, such as laser annealing and/or low temperature epitaxial deposition, does not damage the underlying memory structure. The steps of forming a single-layer (2D) memory array described with respect to FIGS. 3-11B may be repeated to form a multi-layer (3D) memory array.

Figure 12:
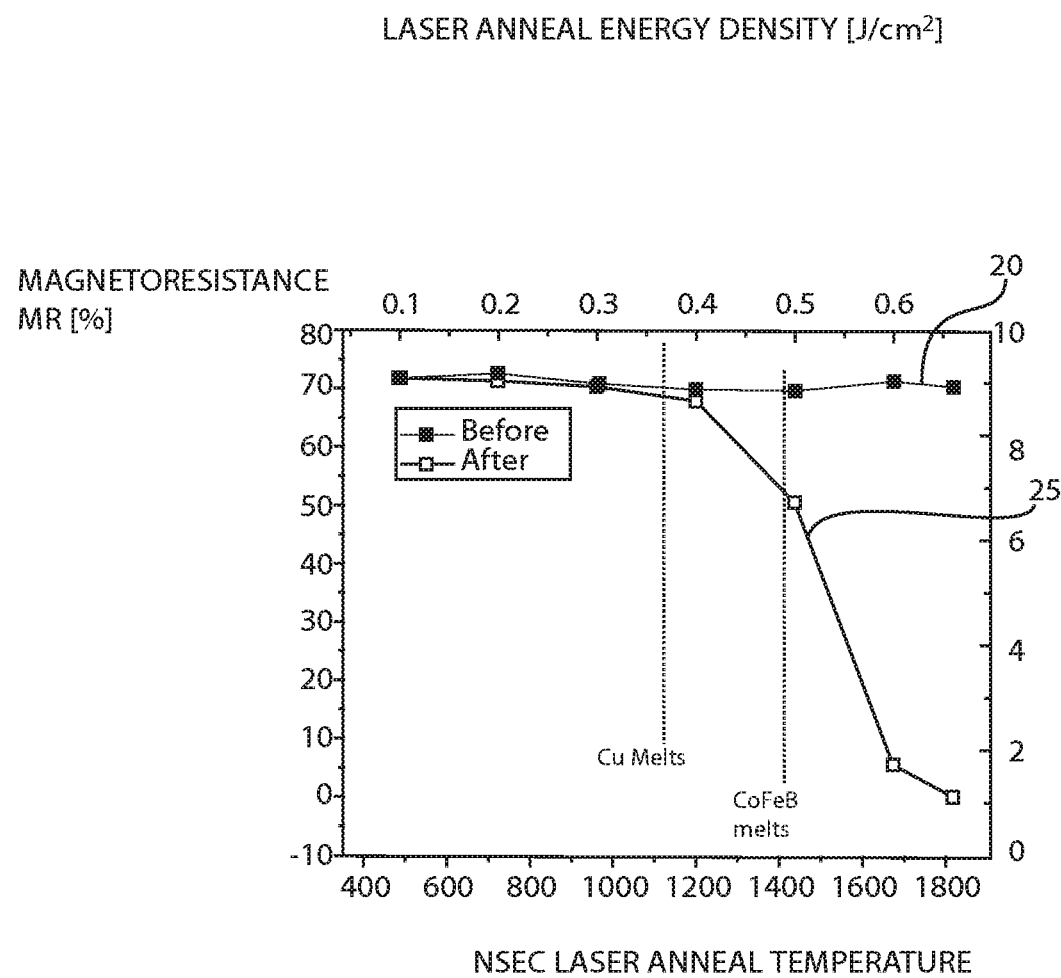
FIG. 12 is a plot of magnetoresistance MR [%] of an exemplary memory device as a function of nanosecond (nsec) laser anneal temperature applied to the second transistor (upper transistor).

FIG. 12 is a plot of magnetoresistance MR [%] of an exemplary memory device 200 as a function of nanosecond (nsec) laser anneal temperature applied to the second transistor (upper transistor) 300. The plot identified by reference number 20 is measurement of magnetoresistance of a memory device 200, as depicted in FIGS. 2A-2C, to convert an amorphous material layer to a crystalline material layer, as described with reference to FIGS. 3 and 4. The plot identified by reference number 25 is measurement of magnetoresistance of a memory device 200, as depicted in FIGS. 2A-2C, following the second transistor 300 being subjected to a nanosecond laser anneal to convert an amorphous material layer to a crystalline material layer, as described with reference to FIGS. 3 and 4. As illustrated in FIG. 12, a memory device 200, e.g., magnetic tunnel junction (MTJ), can be subjected to laser annealing applied to the second transistor 300 at temperatures as great as approximately 1150° C. without the memory device 200 exhibiting substantial degradation.

Having described preferred embodiments of a stackable symmetrical operation memory bit cell structure with bidirectional selectors, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
   a first transistor present on an upper surface of a substrate, the first transistor being vertically orientated so that a first plane extending from a first source region to a first drain region of the first transistor is perpendicular to a plane defined by the upper surface of the substrate;
   a memory device present on the first transistor, and
   a second transistor comprising crystalline semiconductor material directly atop a metal contact surface of the memory device, the second transistor being vertically orientated so that a second plane extending from a second source region to a second drain region of the second transistor is perpendicular to the plane defined by the upper surface of the substrate, wherein the second transistor, the memory device and the first transistor are vertically stacked in a two transistor one memory device cell.

2. The electrical device of claim 1, wherein the memory device maintains its magnetoresistance following application of a nanosecond laser anneal having a temperature of up to 1150° C. applied to the second transistor to provide a crystal structure for the crystalline semiconductor material.

3. The electrical device of claim 1, wherein the second transistor is a vertical field effect transistor (VFET).

4. The electrical device of claim 3, wherein the crystalline semiconductor material is a polycrystalline semiconductor material.

5. The electrical device of claim 4, wherein the polycrystalline semiconductor material is polycrystalline silicon.

6. The electrical device of claim 1, wherein the memory device is selected from the group consisting of phase change memory (PCM) device, a magnetic random access memory (MRAM) device, a resistive random access memory (RRAM) device, and a combination thereof.

7. The electrical device of claim 6, wherein the crystalline semiconductor material of the second transistor is in direct contact with a metal layer of the memory device.

8. The electrical device of claim 1, wherein the first transistor is a vertical field effect transistor (VFET).

* * * * *